(12) United States Patent
Hirobe

(10) Patent No.: US 7,876,637 B2
(45) Date of Patent: Jan. 25, 2011

(54) SEMICONDUCTOR DEVICE AND MEMORY

(75) Inventor: Atsunori Hirobe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 143 days.

(21) Appl. No.: 11/935,639

(22) Filed: Nov. 6, 2007

(65) Prior Publication Data

US 2008/0106965 A1    May 8, 2008

(30) Foreign Application Priority Data

Nov. 7, 2006  (JP)  ............................. 2006-301980
Dec. 22, 2006 (JP)  ............................. 2006-345398

(51) Int. Cl.
  *G11C 5/14* (2006.01)
(52) U.S. Cl. ...................... 365/226; 365/205; 365/208; 365/227
(58) Field of Classification Search ................ 365/226, 365/189.11, 189.09, 189.06, 202, 230.03, 365/196, 207
See application file for complete search history.

(56) References Cited

U.S. PATENT DOCUMENTS

| | | | |
|---|---|---|---|
| 5,337,282 A * | 8/1994 | Koike | ......................... 365/222 |
| 6,072,739 A | 6/2000 | Kokubo | |
| 6,198,683 B1 * | 3/2001 | Ishii et al. | .................... 365/226 |
| 6,671,217 B2 | 12/2003 | Takemura et al. | |
| 6,934,210 B2 * | 8/2005 | Akiba et al. | ................. 365/222 |
| 7,002,397 B2 * | 2/2006 | Kubo et al. | .................. 327/534 |
| 7,088,636 B2 * | 8/2006 | Akiba et al. | ................. 365/226 |
| 2005/0083762 A1 * | 4/2005 | Ikai et al. | ..................... 365/226 |
| 2005/0276110 A1 * | 12/2005 | Sakurai et al. | ......... 365/185.18 |
| 2006/0214731 A1 * | 9/2006 | Kelly et al. | ................. 330/292 |

FOREIGN PATENT DOCUMENTS

| | | |
|---|---|---|
| JP | 2000-149565 | 5/2000 |
| JP | 2003-257181 | 9/2003 |

* cited by examiner

*Primary Examiner*—Pho M Luu
*Assistant Examiner*—Tha-O Bui
(74) *Attorney, Agent, or Firm*—Young & Thompson

(57) ABSTRACT

A semiconductor device of the present invention comprises a first step-down voltage circuit to generate a first step-down voltage lower than an externally-supplied power supply voltage, and a second step-down voltage circuit to generate a second step-down voltage lower than the first step-down voltage. The first step-down voltage circuit has a withstand voltage no lower than the power supply voltage and the second step-down voltage circuit has a withstand voltage no lower than the first step-down voltage.

16 Claims, 19 Drawing Sheets

SEMICONDUCTOR DEVICE AND MEMORY

BACKGROUND OF THE INVENTION

1. Field of the Invention

The present invention relates to a semiconductor device and memory in which a step-down voltage circuit that generates a voltage lower than a power supply voltage is mounted.

2. Description of the Related Art

A DRAM normally comprises a word (and the like)-driving thick film-type transistor and a logic section (and the like)-driving thin film-type transistor. Thin film-type transistor can be actuated using a voltage of the order of, for example, 2.5V, while a thick film-type transistor can be actuated using a voltage of the order of, for example, 3.3V. However, from the viewpoint of power consumption reduction, memory cells are operated using a voltage of the order of, for example, 1.8V. Thereupon, a step-down voltage circuit for stepping down a power supply potential VDD0 to, for example, 1.8V is required (for example, see Japanese Unexamined Patent Application Publication No. 2000-149565).

FIG. 18 is a diagram of a conventional memory and a step-down voltage circuit provided in the periphery thereof. As shown in FIG. 18, a step-down voltage circuit unit 110 comprises a power supply terminal 111 for supplying an external system power supply VDD0 of, for example, 3.3V, and step-down voltage circuits 112, 113. The power supply potential VDD0 is supplied without alteration to an I/O interface 31 and so on. In addition, a step-down voltage V1 obtained by stepping down of an external power supply DVV0 to, for example, 2.5V is supplied to a peripheral logic circuit 20. The step-down voltage circuit unit 110 comprises the step-down voltage circuit 112 for this purpose. The step-down voltage circuit 112 generates the step-down voltage V1 from the power supply potential VDD0. In addition, a memory cell 21 is supplied with an even lower step-down voltage V2 of, for example, 1.8V. The step-down voltage circuit unit 110 comprises the step-down voltage circuit 113 for this purpose. The step-down voltage circuit 113 generates the step-down voltage V2 from the power supply potential VDD0.

Meanwhile, as is described in cited Japanese Unexamined Patent Application Publication No. 2003-257181 (Takemura et al.) and as shown in FIG. 19, in an overdrive system, after a word line is activated and rises to a word line step-up voltage VPP a bit line is activated, whereupon a high-side bit line (T), to an array internal step-down voltage VDL, and a low-side bit line (B), to an earthed voltage VSS, are amplified. At this time, an overdrive startup pulse FASAP1T is generated whereupon, subsequent to the high-side bit line (T) having been spread to an overdrive voltage VDDA, a VDL sense amplifier startup signal FASAP1T is generated to stabilize it at the array internal step-down voltage VDL.

The power supply stepping down of a memory cell array can be achieved by the provision of a step-down voltage circuit. However step-down voltage circuit that uses a thick film transistor is required to generate a voltage lower than the high power supply voltage VDD0 in this way. Accordingly, there are associated problems of poor memory cell array responsivity and, in turn, increased current flow to the current mirror and large current consumption.

In addition, actualization of overdrive based on the provision of a step-down voltage circuit requires that the overdrive voltage be taken as the power supply potential and the normal voltage be taken as the step-down voltage. Accordingly, the step-down voltage circuit can only be configured from a VDD-compliant thick-film transistor which, as is described above, results in poor responsivity and is an impediment to improved speed thereof.

SUMMARY

In one embodiment, a semiconductor device comprises a first step-down voltage circuit that generates a first step-down voltage lower than a power supply voltage and a second step-down voltage circuit that generates a second step-down voltage lower than the first step-down voltage. The first step-down voltage circuit has a withstand voltage equal to or higher than the power supply voltage, and the second step-down voltage circuit has a withstand voltage equal to or higher than the first step-down voltage.

In another embodiment, a memory comprises a first step-down voltage circuit which is commonly provided for a plurality of banks and which generates, from a power supply voltage, a first step-down voltage lower than the power supply voltage, second step-down voltage circuits which are individually provided for each bank and which generate, from the first step-down voltage, a second step-down voltage lower than the first step-down voltage, and a plurality of memory banks driven by the second step-down voltage. The first step-down voltage circuit has a withstand voltage no lower than the power supply voltage, and the second step-down voltage has a withstand voltage no lower than the first step-down voltage.

In the present invention, a second step-down voltage circuit generates a second step-down voltage from a first step-down voltage lower than an externally-supplied power supply voltage. Accordingly, because it has a withstand voltage no lower than the first step-down voltage, the present invention can be configured using a transistor of lower withstand voltage than in a circuit in which a second step-down voltage is generated from an externally-supplied power supply voltage. That is to say, according to the present invention, a semiconductor device and memory that facilitate fast response and reduced power consumption can be provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1B:
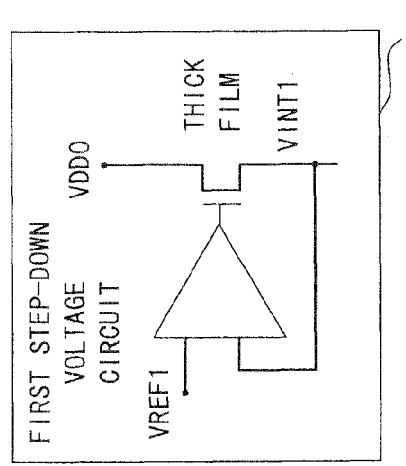
FIG. 1B is a schematic diagram of a first step-down voltage circuit.
Figure 1C:
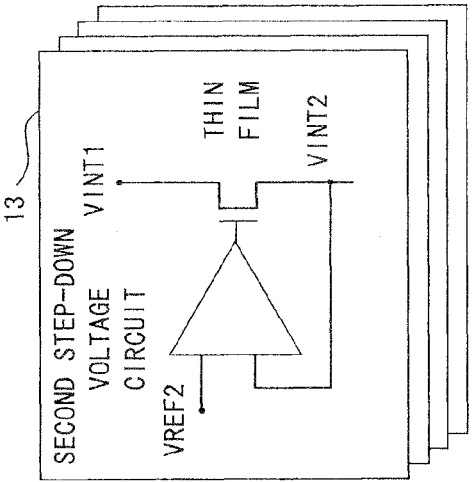
FIG. 1C is a schematic diagram of a second step-down voltage circuit.
Figure 1A:
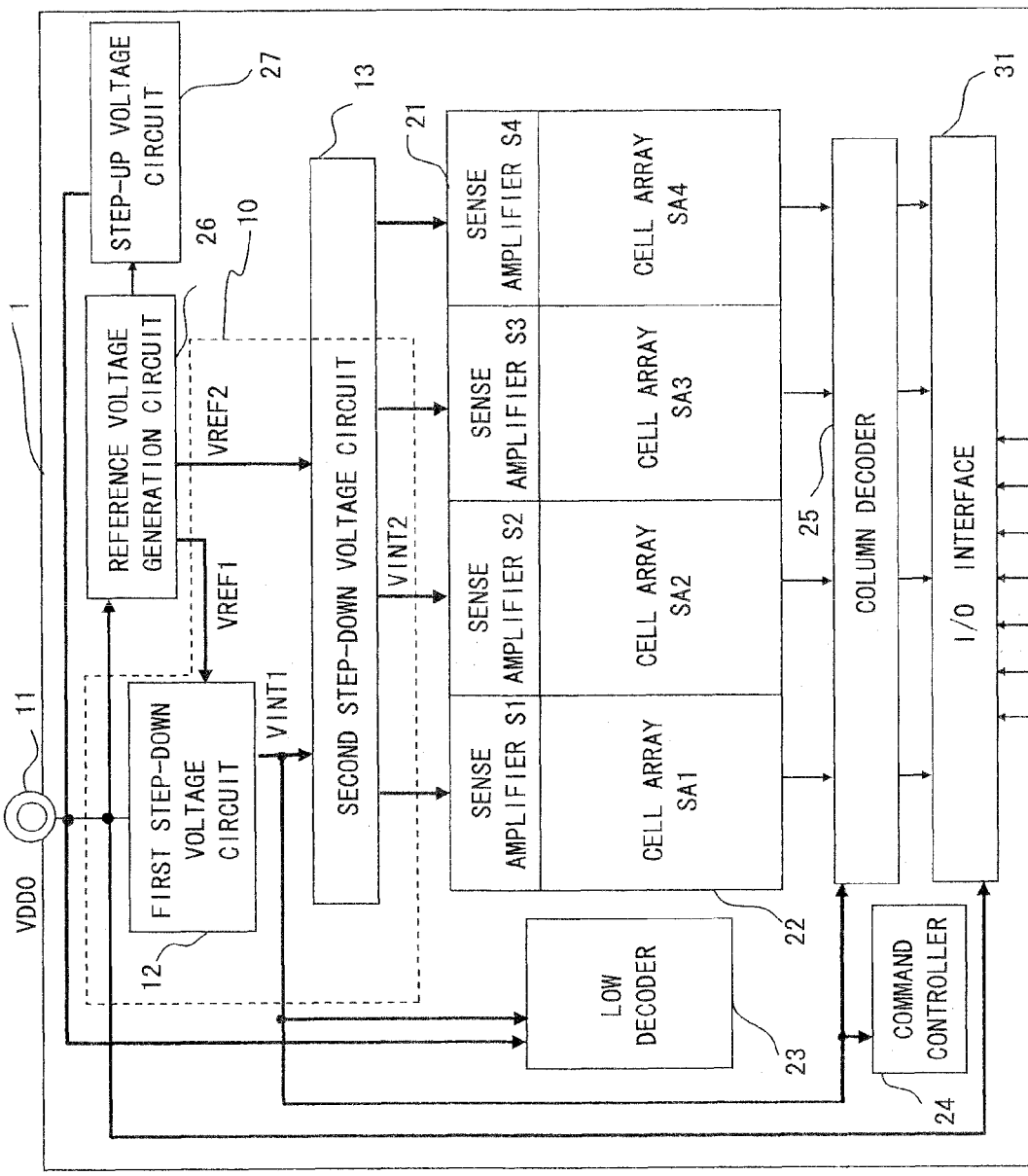
FIG. 1A is a block diagram showing a semiconductor device as one embodiment of the present invention.

Specific embodiments in which the present invention has application will be hereinafter described in detail with reference to the drawings. FIG. 1A is a block diagram showing a semiconductor device as one embodiment of the present invention. In addition, FIG. 1B is a schematic diagram of a first step-down voltage circuit, and FIG. 1C is a schematic diagram of a second step-down voltage circuit. As shown in FIG. 1A, an semiconductor device 1 comprises a step-down voltage circuit unit 10, a reference voltage generation circuit 26, sense amplifiers S1 to S4 (21), cell arrays SA1 to SA4 (22), a low decoder 23, a command controller 24, a column decoder 25, a step-up voltage circuit 27 and an I/O interface 31 and so on. The step-down voltage circuit unit 10 comprises a first step-down voltage circuit 12 and a second step-down voltage circuit 13 and so on.

The reference voltage generation circuit 26 generates a reference voltage VREF1 of, for example, 2.5V, and a reference voltage VREF2 of, for example, 1.8V in accordance with an external voltage VDD0 from an external system supplied to the first step-down voltage circuit 12 and second step-down voltage circuit 13 respectively. The power supply potential VDD0 from the external system is supplied to the first step-down voltage circuit which, in accordance with the VREF1, generates a first step-down voltage (first internal voltage) VINT1 (=VREF1).

The VINT1 from the first step-down voltage circuit 12 is supplied to the second step-down voltage circuit 13 which, in accordance with a reference voltage VREF2, generates a second step-down voltage circuit (second internal voltage) VINT2 (VREF2).

The low decoder 23 supplies a voltage obtained by stepping up of the power supply potential VDD0 by the step-up voltage circuit 27 to a selected word line. In addition, it generates low addresses which it inputs to the sense amplifiers S1 to S4. The column decoder 25 generates column addresses which it inputs to the sense amplifiers S1 to S4. The command controller 24 apportions the signals by which the low decoder 23 and column decoder 25 generate low addresses and column addresses from a serial signal. The low decoder 23, column decoder 25 and command controller 24 are operated by the first step-down voltage VINT1 generated by the first step-down voltage circuit 12.

The I/O interface control the data exchange between the memory cell array 22 and external terminal 32. The I/O interface 31 is operated in accordance with an external voltage.

This embodiment comprises two types of step-down voltage circuit. That is to say, first, as shown in FIG. 1B, it comprises the first step-down voltage circuit 12 for generating the first step-down voltage VINT1 of, for example, 2.5V from an external voltage VDD0 of, for example, 3.3V. Furthermore, as shown in FIG. 1C, it comprises the second step-down voltage circuit 13 for generating the second step-down voltage VINT2 of a lower voltage than even the first step-down voltage VINT1 of, for example, 1.8V.

For this reason, the first step-down voltage circuit 12 is configured to have a withstand voltage equal to or more than the power supply voltage, and the second step-down voltage circuit 13 is configured to have a withstand voltage equal to or more than the first step-down voltage circuit. That is to say, the thickness of the oxide film transistor from which the first step-down voltage circuit is configured is thicker than the thickness of the oxide film transistor from which the second step-down voltage circuit is configured.

Figure 2:
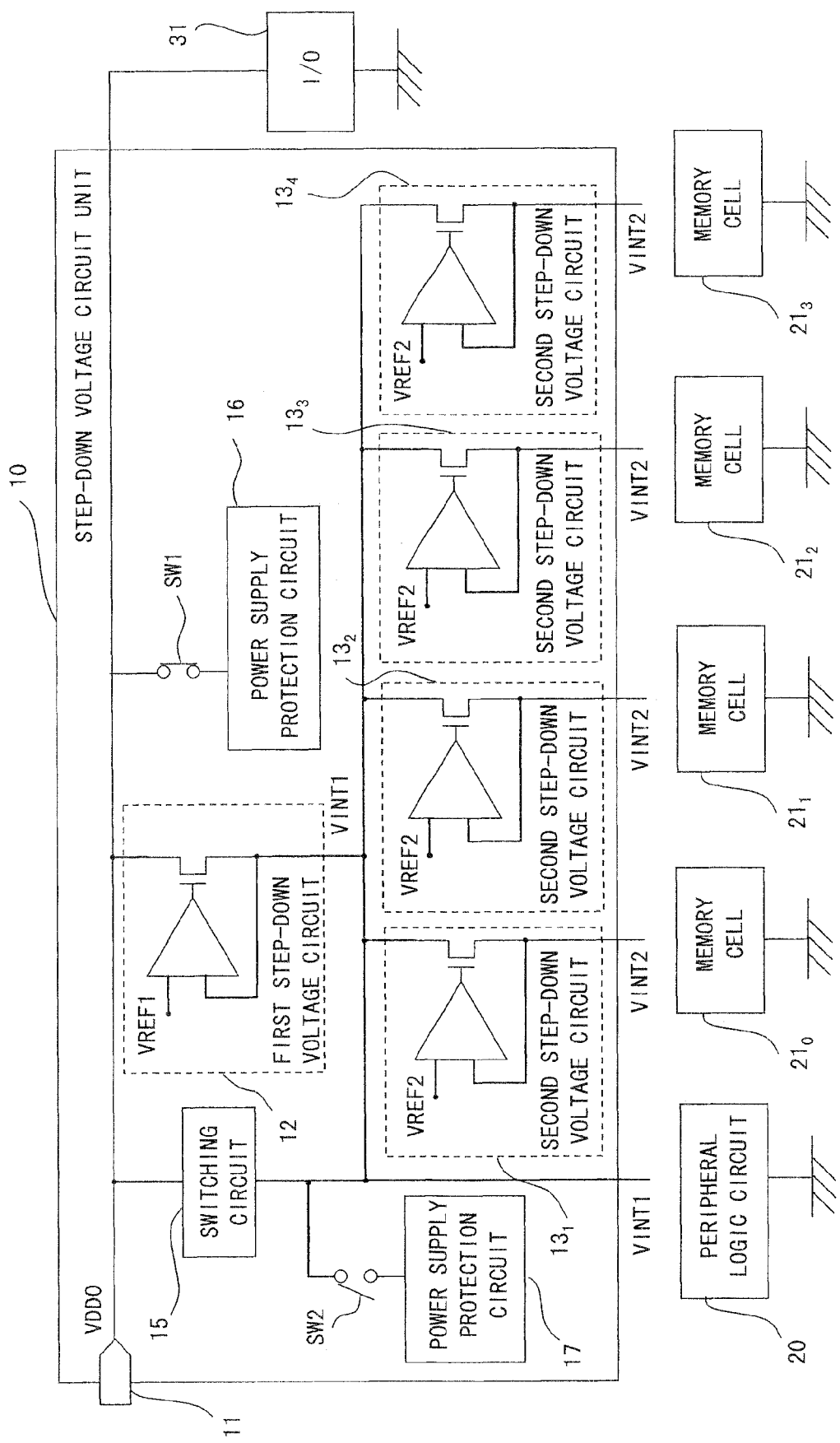
FIG. 2 is a block diagram that shows the step-down voltage circuit portion of FIG. 1 in more detail.

FIG. 2 is a block diagram that shows the step-down voltage circuit portion of FIG. 1 in more detail. Identical symbols have been used to denote constituent elements 1 of the step-down voltage circuit part shown in FIG. 2 that are identical to those of the semiconductor device of FIG. 1 and, accordingly, a detailed description thereof has been omitted. As shown in FIG. 2, the step-down voltage circuit unit 10 comprises the first step-down voltage circuit 12, second step-down voltage circuits $13_1$ to $13_4$, power supply protection circuits 16, 17, and a switching circuit 15.

The first step-down voltage circuit 12 converts the external power supply VDD0 from the external system to the first step-down voltage VINT1 as described above, and supplies the generated first step-down voltage VINT1 to the peripheral logic circuit 20 and the second step-down voltage circuits $13_1$ to $13_4$.

The switching circuit 15 is provided between a power supply terminal 11 to which the external power supply is supplied and the second step-down voltage circuits $13_1$ to $13_4$, and is configured so that, as a result of the switching circuit 15 being turned ON, the external power supply, and not the first step-down voltage VINT1 from the first step-down voltage circuit 12, is directly supplied to the second step-down voltage circuits $13_1$ to $13_4$. A mask switching of the switching circuit 15 using an aluminium master slice may be performed, or electrical signal switching based on test mode and phase information and so on may be performed. Here, when the external power supply voltage is the same as the first step-down voltage, that is to say, when the external power supply is lower, there is no requirement for the first step-down voltage circuit. Because this embodiment comprises the switching circuit 15, the external voltage from the power supply terminal 11 can be directly supplied to the second step-down voltage circuits 13₁ to 13₄ and the peripheral logic circuit 20 without using the first step-down voltage circuit 12.

In addition, the power supply protection circuit 16 is connected to the external power supply line from the power supply terminal 11 by way of a switch SW1. In addition, the power supply protection circuit 17 is connected to a first step-down voltage supply line by way of a switch SW2. A mask switching of the switching switch SW1 and SW2 using an aluminium master slice may be performed, or electrical signal switching based on test mode and phase information and so on may be performed. When the external power supply is supplied to the first step-down voltage circuit 12, the switch SW1 is turned ON to operate the power supply protection circuit 16. In addition, when the external power supply is directly supplied to the second step-down voltage circuit 13 rather than by way of the first step-down voltage circuit 12, the switch SW2 is turned ON to operate the power supply protection circuit 17.

As is described above, the second step-down voltage circuits 13₁ to 13₄ convert the first step-down voltage VINT1 to generate the second step-down voltage VINT2. Because the first step-down voltage VINT1 is lower than the external power supply, a transistor of lower withstand voltage than the first step-down voltage circuit 12 can be used by the second step-down voltage circuit 13. That is to say, because a thin oxide film transistor can be used, the switching speed is improved and a reduction in power consumption is realized.

Because this embodiment comprises a first step-down voltage circuit 12 for stepping down the voltage of the external power supply and a second step-down voltage circuit 13 for further stepping down the first step-down voltage VINT1 stepped down by the first step-down voltage circuit 12, a step-down voltage circuit configured from a oxide film transistor thinner than used for generating a second step-down voltage from an external power supply can be used as the second step-down voltage circuit 13. Accordingly, because a thin oxide film is used, the flow of current to the current mirror can be reduced and responsivity can be improved.

The present invention is not limited to the embodiment described above, and a variety of modifications that do not depart from the gist of the invention are possible. For example, for the purpose of improving the amplification efficiency of a sense amplifier in a DRAM, an "overdrive system" that uses a voltage higher than a restore voltage to drive the sense amplifier driving in the initial stage of cell data amplification is provided. The application of this system to the step-down voltage circuit of this application affords a more effective supply of a stable step-down voltage to the DRAM core. Furthermore, this overdrive may be applied to all step-down voltage circuits or instead to a portion of the step-down voltage circuits and, furthermore, the step-down voltage can be obviously be more effectively supplied by optimizing the timing at which the overdrive is implemented.

Embodiment 2

Figure 3:
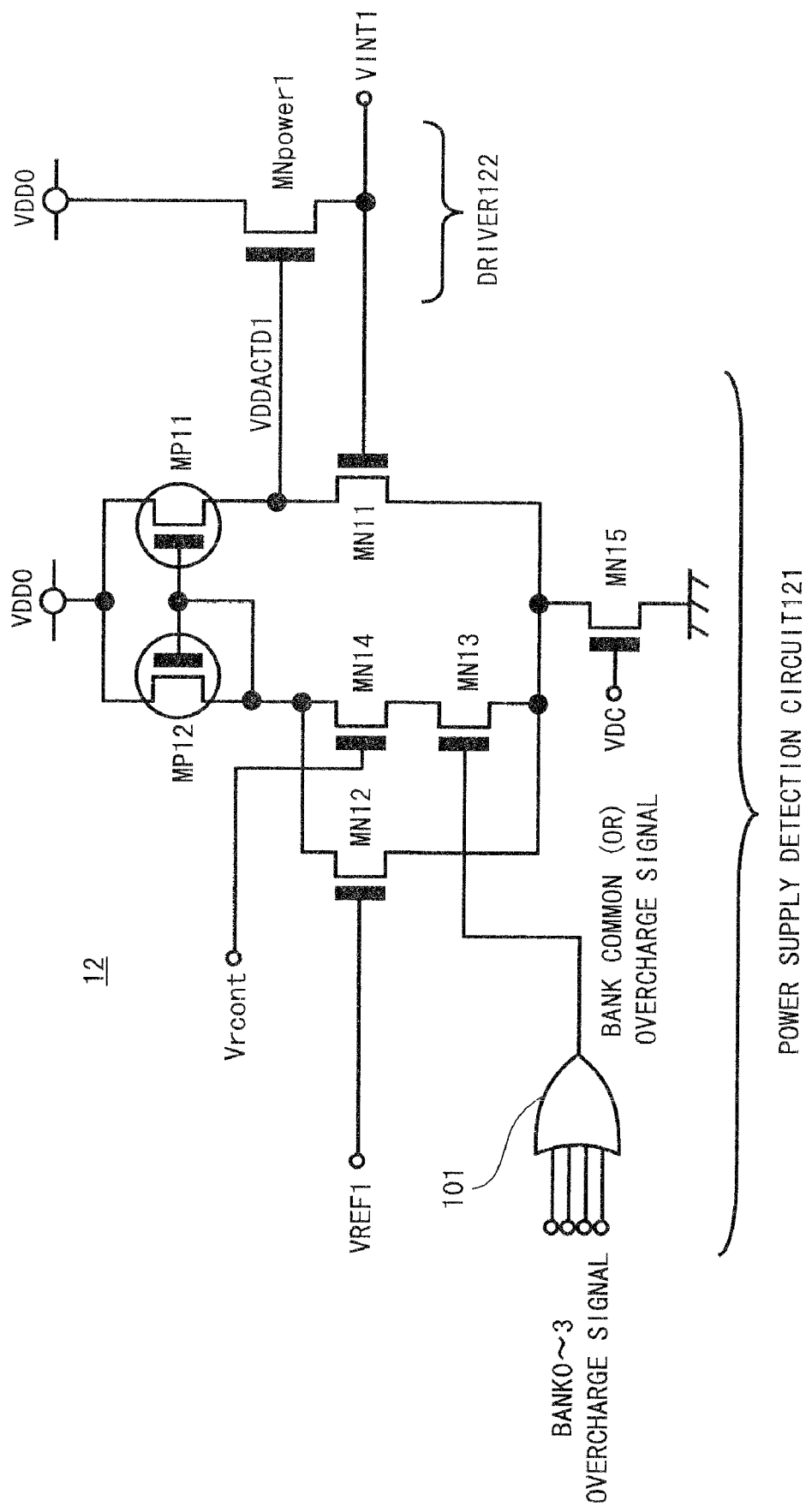
FIG. 3 is a circuit diagram that shows the specific configuration of the first step-down voltage circuit 12.
Figure 4:
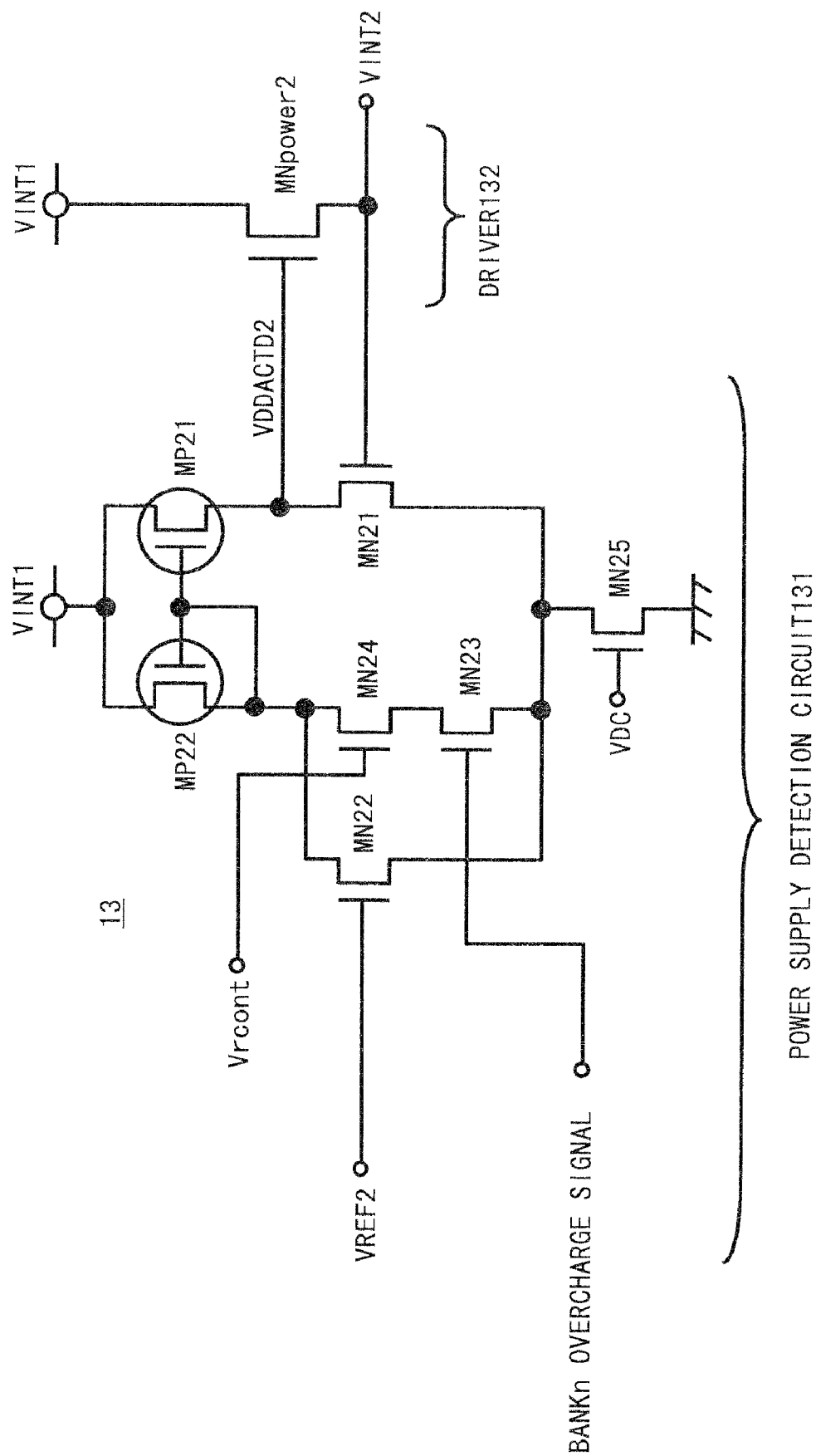
FIG. 4 is a circuit diagram that shows the specific configuration of the second step-down voltage circuit 13.

Embodiment 2 of the present invention will be hereinafter described. FIG. 3 and FIG. 4 are circuit diagrams that show the specific configuration of the first step-down voltage circuit 12 and second step-down voltage circuit 13. Identical symbols have been used to denote constituent elements of this embodiment that are identical to the constituent elements of embodiment 1 shown in FIG. 1 and FIG. 2 and, accordingly, a detailed description thereof has been omitted. As shown in FIG. 3, the first step-down voltage circuit 12 comprises a power supply detection circuit 121 and a driver 122.

The power supply detection circuit 121 comprises N-channel MOS transistors MN11 to MN15 and P-channel MOS transistors MP11, MP12. The driver 122 is configured from an N-channel MOS transistor MNpower1. The gate films of these transistors are thick. Here, as the transistors from which the amplifiers are configured, the MN12 to which the reference voltage VREF1 is input is provided as the first transistor and the MN11 configured as a differential pair with the MN12 is provided as the second transistor. In addition, the MN13 to which a later-described BANK common overcharge signal is input is provided in parallel with the MN12. The NM13 constitutes a voltage adjustment transistor for adjusting the voltage of the VINT1, while the MN14 constitutes a current adjustment transistor for adjusting the current flowing to the MN13.

The MP11 and MP12 are configured as a current mirror with their gates connected and their sources connected to a power supply potential VDD0. The gate and drain of the MP12 are short circuited, a drain of the MN14 is connected to the drain thereof, and the MN13 is connected in series to the MN14. In addition, the MN12 is connected in parallel with the series-connected MN14 and MN13. Furthermore, the MN11 drain is connected to the MP11 drain with its gate connected to the MNpower1 source. In addition, the MN11 and MN13 sources are connected to the MN15 drain and, while the MN15 source is earthed, a VDC is supplied to the gate thereof. Whether or not the power supply detection circuit 121 is operated is set in accordance with the VDC value. Output of the OR circuit 101 is connected to the MN13 gate, a later-described BANK common overcharge signal is being input thereto from the OR circuit 101. In addition, the VREF1 is supplied to the MN12 gate, and a Vrcont is supplied to the MN14 gate. The VREF1 constitutes a voltage for setting the VINT1 value when the BANK common overcharge signal is Low. The Vrcont constitutes a voltage for setting the ON resistance of the MN14, the ON resistance of the MN14 reducing as the Vrcont increases.

The MNpower1 drain is connected to the power supply electrical potential VDD0 with its gate connected to the MP11 drain (MN11 drain) to which a VDDACTD1 is supplied. The source thereof is connected to an output terminal to which the VINT1 is output. VINT1, as is described above, constitutes a first stage step-down voltage circuit output voltage.

The operation of the first step-down voltage circuit 12 will be hereinafter described. The power supply detection circuit 121 compares the electric potential difference of the VINT1 and VREF1 to control the gate voltage (VDDACTD1) of the driver 122. That is to say, when the VINT1 voltage drops as a result of current consumption, an operation involving detection of VINT1<VREF1 is detected and rise of the VDACTD1 is performed.

Here, the MN13 to the gate of which the BANK common overcharge signal is input and the MN12 to the gate of which the VREF1 is input are connected in parallel. For this reason, when the VREF1 and the BANK common overcharge signal are High, current flows to this two stage transistor. Subsequently, a pseudo-rise in the VREF1 of the power supply detection circuit 121 occurs and offset is generated. When a prediction that a large volume of current will be consumed by the later-described second step-down voltage circuit 13 is sensed, the first step-down voltage circuit 12 presets the VDDACTD1 to a high level in readiness for the consumption of current by the second step-down voltage circuit 13.

This will be specifically described. When the BANK common overcharge signal is Low and VINT1 drops, less current flows to the MN11 decreases. As a result, more current flows to the MP11. In response thereto, the VDDACTD1 rises and the VINT1 rises.

In addition, because the MN12 is ON when the BANK common overcharge is High, current flows to the MN12 and MN14 in parallel. That is to say, a pseudo-rise state of the VREF1 is established. Accordingly, the VINT1 drops. As a result, the current flowing to the MN11 decreases and the current flowing to the MP11 increases. In response, the VDDACTD1 rises.

The second step-down voltage circuit will be hereinafter described. As shown in FIG. 4, the second step-down voltage circuit 13 comprises a power supply detection circuit 131 and driver 132. The configuration of the second step-down voltage circuit 13 pertaining to this embodiment is fundamentally the same as the configuration of the first step-down voltage circuit 12. However, the gate films of the transistors from which it is configured are thin.

As shown in FIG. 4, the power supply detection circuit 131 comprises N-channel MOS transistors MN21 to MN25, and P-channel MOS transistors MP21, MP22. The driver 132 is configured from an N-channel MOS transistor MNpower2. Here, as the transistors from which the amplifiers are configured, MN22 to which the reference voltage VREF2 is input is provided as the first transistor, and MN21 configured as a differential pair with the MN22 is provided as the second transistor. In addition, the MN23 to which a later-described BANK common overcharge signal is input is provided in parallel with the MN22. The MN23 constitutes a voltage adjustment transistor for adjusting the voltage of the VINT2, while the MN24 constitutes a current adjustment transistor for adjusting the current flowing to the MN23.

The MP21 and MP22 are configured as a current mirror with their gates connected and their sources connected to a power supply potential VDD0. The gate and drain of the MP22 are short circuited, a drain of the MN24 is connected to the drain thereof, and the MN23 is connected in series to the MN24. In addition, the MN22 is connected in parallel with the series-connected MN24 and MN23. Furthermore, the MN21 drain is connected to the MP21 drain with its gate connected to the MNpower2 source. In addition, the MN21 and MN23 sources are connected to the MN25 drain and, while the MN25 source is earthed, a VDC is supplied to the gate thereof. Whether or not the power supply detection circuit 131 is operated is set in accordance with the VDC value. A later-described BANK0 overcharge signal is input to the MN23 gate. The second step-down voltage circuit is used at BANK0. In addition, a VREF2 is supplied to the MN22 gate, and a Vrcont is supplied to the MN24 gate. The VREF2 constitutes a voltage for setting the VINT2 value when the BANK overcharge signal is Low. The Vrcont constitutes a voltage for setting the ON resistance of the MN24, the ON resistance of the MN4 reducing if Vrcont is large.

The Mnpower2 drain is connected to the power supply electrical potential VINT1 with its gate connected to the MP21 drain (MP21 drain) to which a VDDACTD2 is supplied. The source thereof is connected to an output terminal to which the VINT2 is output. VINT2, as is described above, constitutes a second stage step-down voltage circuit output voltage.

The operation of the second step-down voltage circuit 13 will be hereinafter described. When the BANK common overcharge signal is Low and VINT2 drops, less current flows to the MN21. As a result, more current flows to the MP21. In response, the VDDACTD2 rises and the VINT2 rises.

In addition, because the MN22 is ON when the BANK common overcharge is High, current flows to the MN22 and MN24 in parallel. That is to say, a pseudo-rise state of the VREF2 is established. Accordingly, the VINT2 drops. As a result, the current flowing to the MN21 decreases and the current flowing to the MP21 increases. In response, the VDDACTD1 rises.

Figure 5:
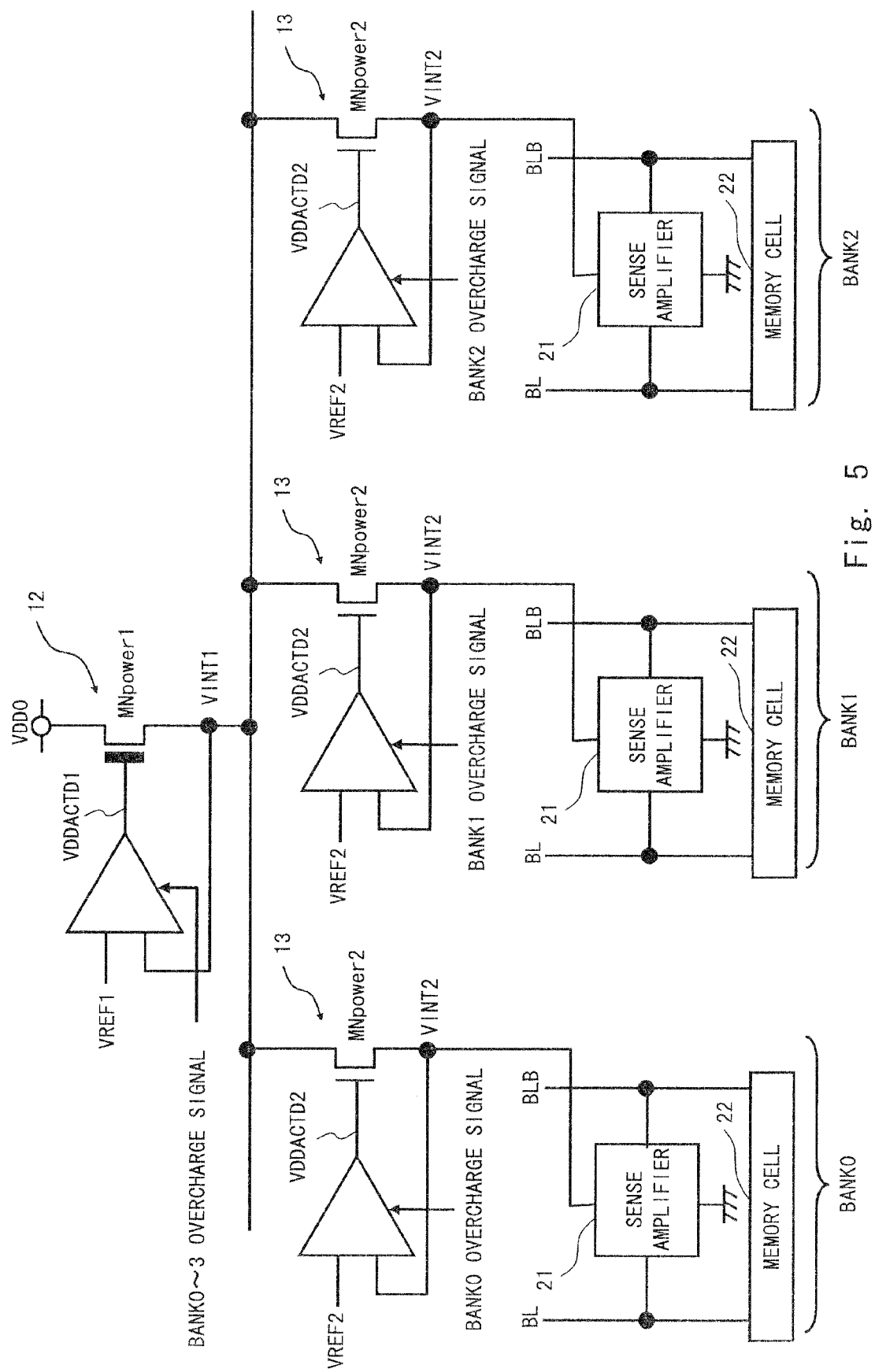
FIG. 5 is a diagram showing sense amplifiers, memory cells and a multi-stage step-down voltage circuit.

The application of this first step-down voltage circuit 12 and second step-down voltage circuit 13 in a memory as illustrated in FIG. 2 described above will be hereinafter described. FIG. 5 is a diagram showing sense amplifiers, memory cells and a multi-stage step-down voltage circuit. Here, the memory cells of BANK0 to BANK2 of the n number of BANKn are shown.

As shown in FIG. 5, the second step-down voltage circuits 13, to which the VINT1 is supplied, are connected to the first step-down voltage circuit 12. The second step-down voltage circuits 13, from which the second step-down voltage VINT2 is supplied to the sense amplifiers thereof, are provided for each BANK. Here, in this embodiment, in order to perform overcharge, BANK0 to BANK3 overcharge signals are input to the first step-down voltage circuit 12. As is described above, these signals are logically summed by the OR circuit 101 and produced as a BANK common overcharge signal. In addition, BANKn overcharge signals in accordance with each BANK are input to the second step-down voltage circuits 13.

Figure 6:
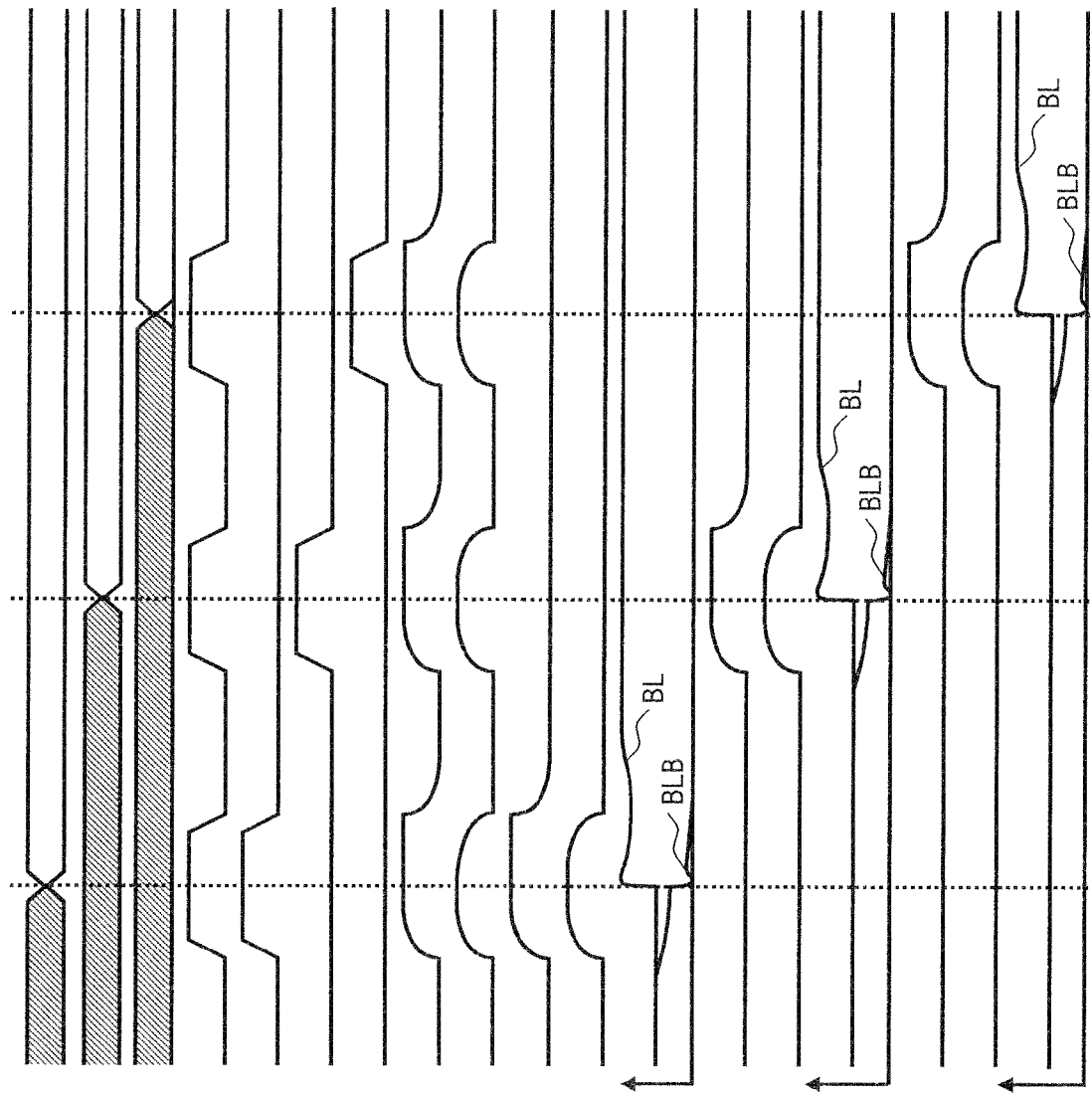
FIG. 6 is a diagram showing the respective signal waveforms input to the first step-down voltage circuit and second step-down voltage circuits.

FIG. 6 is a diagram showing the respective signal waveforms input to the first step-down voltage circuit and second step-down voltage circuits. When the BANK0 overcharge signal is High the BANK common overcharge signal is also High, and the VDDACTD1 voltage rises. As a result, the VINT1 voltage also rises. At this time, the BANK0 VDDACTD2 also rises and, in response thereto, the voltage of the VINT2 rises and leads to the actualization of overcharge. Overcharge produces a gradual increase in the electrical potential difference between the bit lines BL, BLB connected to the sense amplifiers 21 and initiation of the sensing period.

In this way, current is caused to flow to the MN13 in accordance with the BANKn overcharge signal and results in the generation of OFFSET in the power supply detection circuit 121 and rise in the output voltage of the first step-down voltage circuit 12 (forcible activation). As in this embodiment, for two stage stepping down, the output voltage of the first step-down voltage circuit 12 must be raised in conformity with the current consumed by the second stage second step-down voltage circuits 13 connected to the first stage first step-down voltage circuit 12. While DRAM sense amplifiers normally employ various methods such as overdrive and overcharge and consume a large volume of current, in this embodiment the OR of the BANKn overcharge signals (sense signals) input to each BANK is obtained and used to produce a BANK common overcharge signal. Thereafter, as a result of overdrive and overcharge of the first step-down voltage circuit being performed in conformity with the timing of the overdrive and overcharge of the second step-down voltage circuits 13, the charge amount supplied to the second step-down voltage circuits 13 is compensated. As a result, the responsivity of the first step-down voltage circuit 12 can be improved, power supply drop to the first step-down voltage circuit 12 can be reduced, and the high-speed operation of the second step-down voltage circuit 13 can be compensated.

Figure 7:
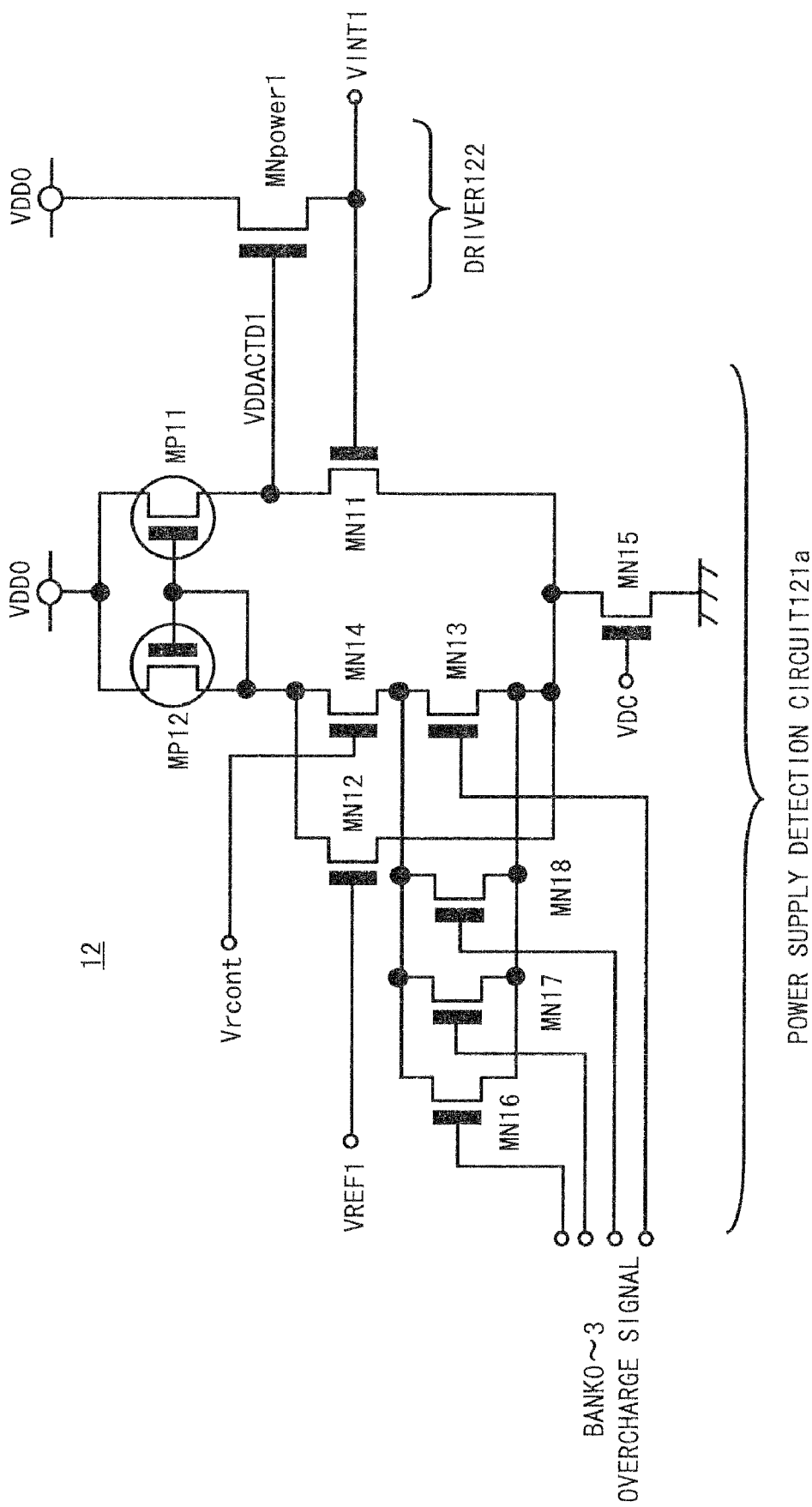
FIG. 7 is a circuit diagram showing another specific configuration of the second step-down voltage circuit of embodiment 2 of the present invention.

FIG. 7 is a circuit diagram showing another specific configuration of the second step-down voltage circuit of the embodiment 2 of the present invention. While this embodiment describes input of BANK0 to 3 overcharge signals to the OR circuit 101 to generate BANK common overcharge signals, as shown in FIG. 7, the logical sum of the BANK0 to 3 overcharge signals can also be determined within the power supply detection circuit 121*a*. That is to say, the MN16 to MN18 are connected in parallel with the MN13, and the BANK0 to 3 overcharge signals may be input to the MN13 and MN16 to MN18 respectively.

Figure 8:
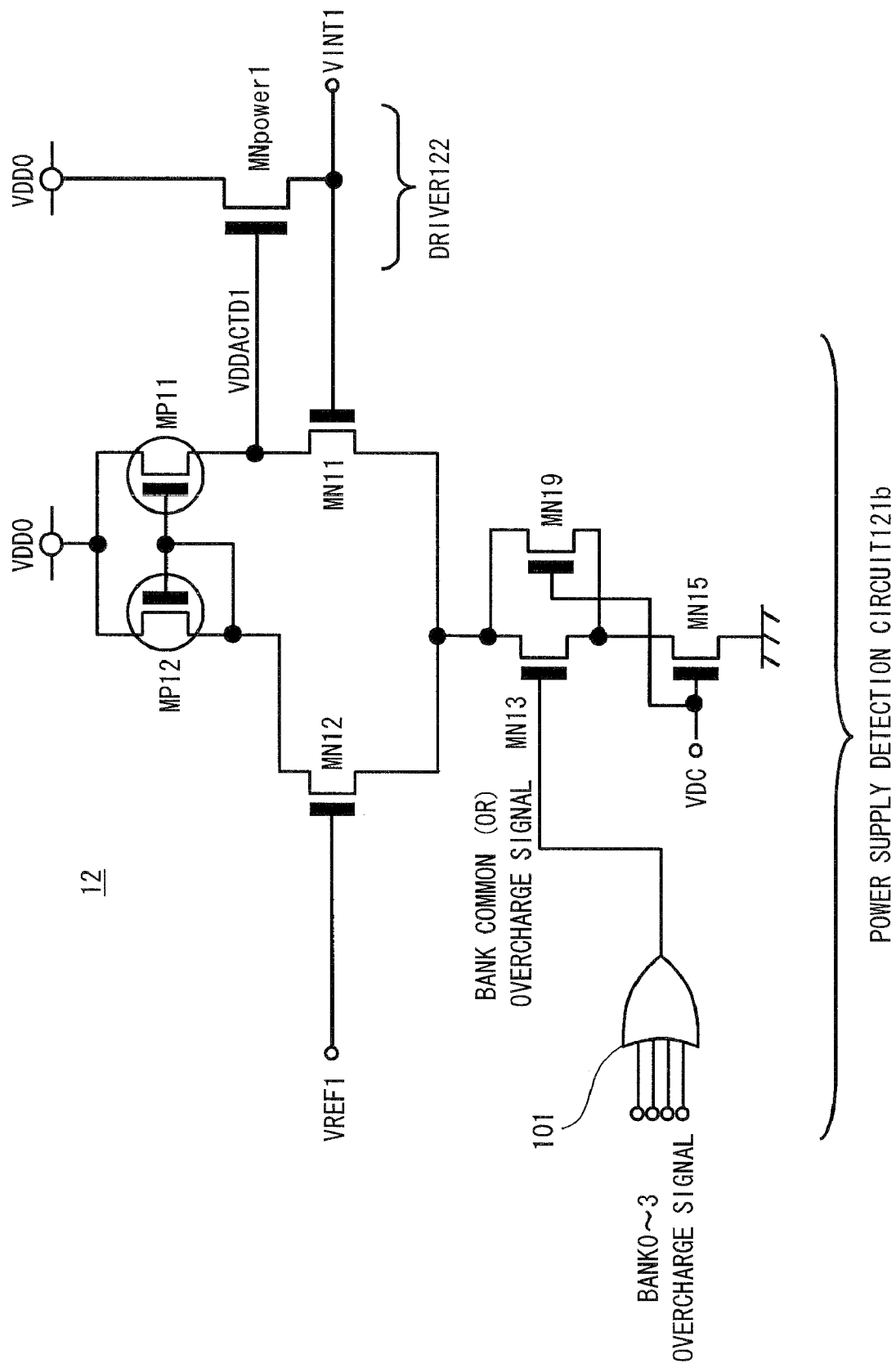
FIG. 8 shows a circuit diagram of a first step-down voltage circuit of a modification of second embodiment.
Figure 9:
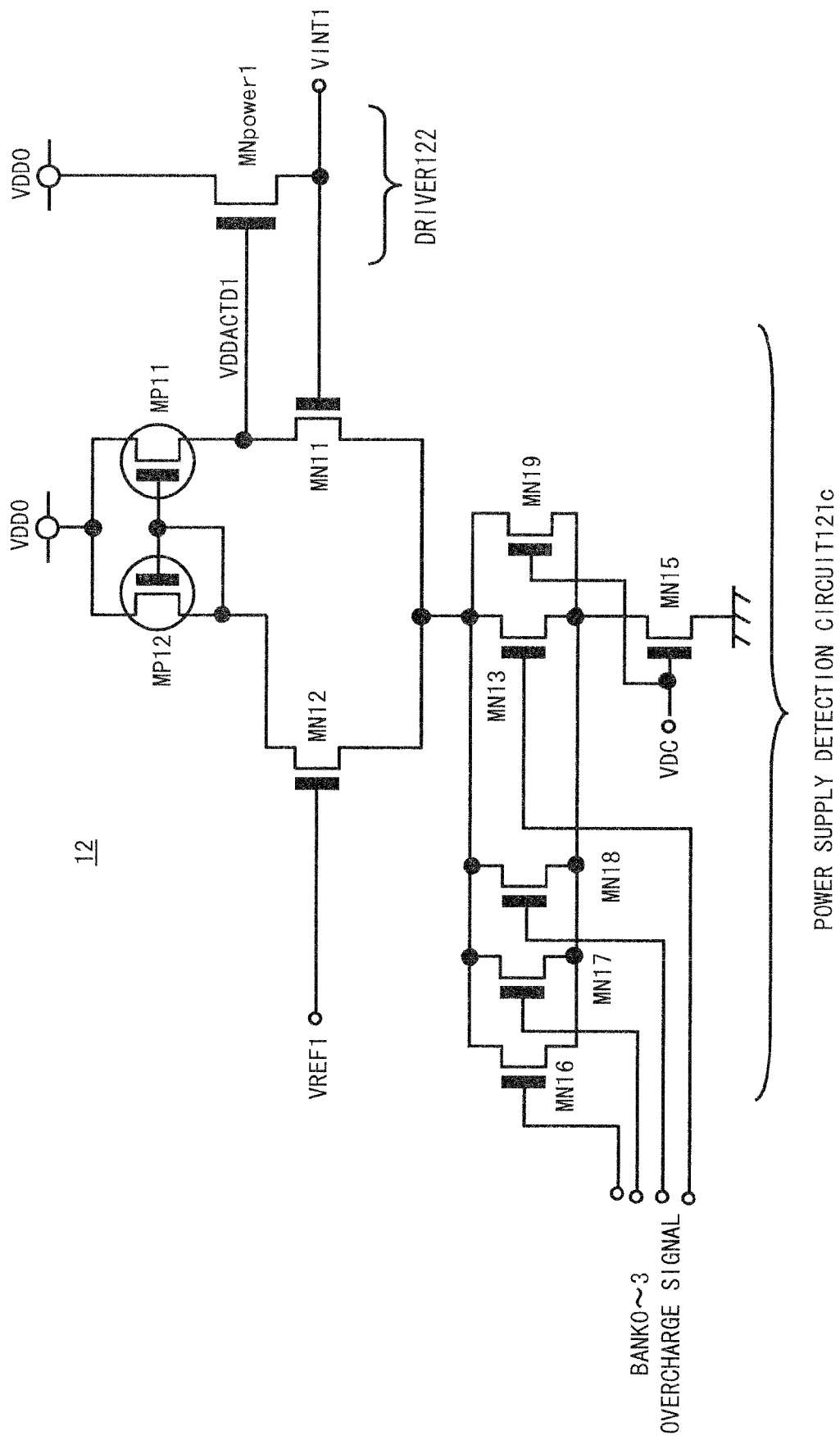
FIG. 9 shows a circuit diagram of a first step-down voltage circuit of a modification of second embodiment.

A modification of this embodiment will be hereinafter described. FIG. 8 and FIG. 9 show circuit diagrams of a first step-down voltage circuit of a modification of this embodiment. While in the first step-down voltage circuit shown in FIG. 3 the current capability is increased by provision of offset between VINT1 and VREF1 and overdrive and overcharge being performed, in this modification amplifier responsivity is controlled by BANK common overcharge signals.

In the example shown in FIG. 8; the MN19 as a second current supply transistor is connected in series between the MN11 and MN12 from which a differential pair is configured and the MN15 serving as the first current supply of the power supply detection circuit 121 shown in FIG. 3. The MN13 serving as a switching transistor for switching between MN19 validation and invalidation is connected in parallel with the MN19. The power supply detection circuit 121*b* inputs a VDC to the MN19 gate and similarly to the MN15. In addition, in the example shown in FIG. 9, similarly to FIG. 7, instead of BANK common overcharge signals being input to the MN12, a MN16 to MN18 are provided in parallel to the MN13 in the power supply detection circuit 121*c* and BANK0 to 3 overcharge signals are input to the MN13 and MN16 to MN18 respectively.

In this way, the first step-down voltage circuit 12 of this modification results in increased current flow to the amplifiers in conformity with the current consumption of the second step-down voltage circuit 13 and increased capability thereof. Here, the responsivity and capability thereof are controlled in conformity with BANKn overcharge signals. Instead of BANKn overcharge signals, the capability can also be increased by input of respective later-described BANKn VDL activation signals.

Embodiment 3

An embodiment 3 of the present invention will be hereinafter described. This embodiment has application in an overdrive method in which, rather than by using the overcharge described above, the charge supply capability is forcibly improved by greater displacement of the gate voltage of the output driver.

Figure 10:
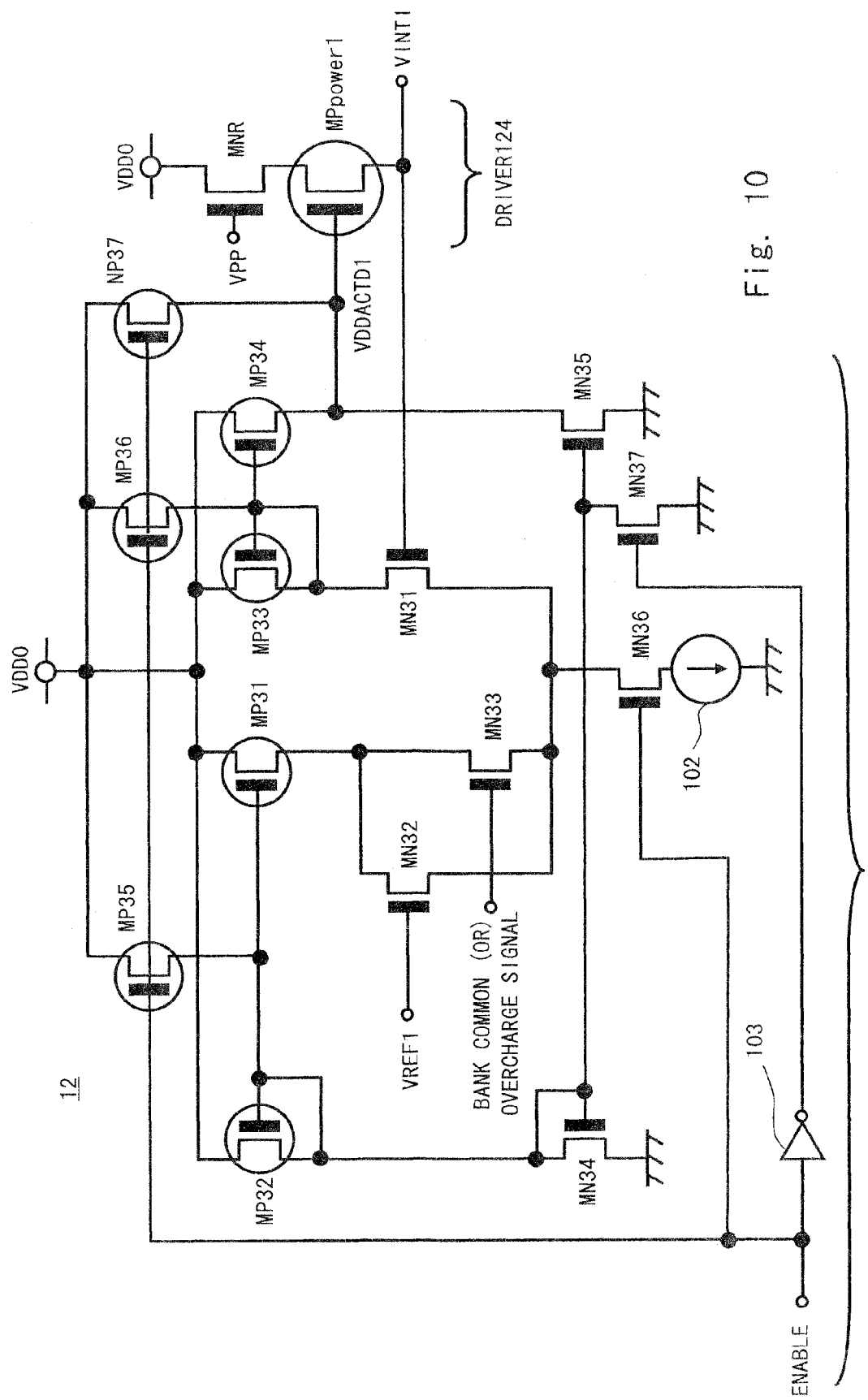
FIG. 10 is a diagram showing the first step-down voltage circuit 12 of third embodiment.

FIG. 10 is a diagram showing the first step-down voltage circuit 12 of this embodiment. The first step-down voltage circuit 12 comprises a power supply detection circuit 123 and a driver 124. The power supply detection circuit 123 comprises N-channel MOS transistors MN31 to MN36, P-channel MOS transistors MP31 to MP37, constant current source 102 and an inverter 103. The driver 124 comprises a P-channel MOS transistor MPpower1 and N-channel MOS transistor MNR provided in series therewith.

The MP35, MP36 and MP37 are connected in parallel with the respective sources thereof connected to the power supply potential VDD0. The MP37 drain is connected to the MPpower1 gate. An ENABL signal is input to the MP35 gate. The ENABL signal constitutes a signal for determining whether or not the power supply detection circuit 123 is to be activated. The ENABL signal constitutes a signal for common activation of the first step-down voltage circuit when the command by which the second step-down voltage circuit is activated is not input from the BANK. When all BANK are inactivated this signal is Low.

The MP35 drain has a common connection with the MP32 and MP31 gates. The MP31 and MP32 are configured as a current mirror with the gates thereof mutually connected and the sources thereof connected to the power supply potential VDD0. The MP32 gate and drain are short-circuited. The MN34 source is connected to the MP32 drain. The MP34 gate and source are short circuited.

The MN32, MN33 drains are connected to the MP31 drain. The MN32 and MN33 are connected in parallel, and the MN36 drain being connected to the sources thereof. The VREF1 is supplied to the MN32 gate, and a BANK common overcharge signal is input to the MN33 gate. The MN36 source is connected to the earth-connected constant current source 102, an ENABL signal being supplied to the gate thereof.

The MP33 and MP34 are configured as a current mirror with the gates thereof mutually connected and also connected to the MP36 drain and the power supply potential VDD0 being supplied to the sources thereof. The MP33 gate and drain are short circuited. The MN31 drain is also connected to the MP33 drain, and the source thereof is connected to the MP36 drain. The gate thereof is connected to the MPpower1 drain with the VINT1 being output from this drain.

The MN35 drain is connected to the MP34 drain with its gate connected to the MN34 gate and the MN34 drain and its source earthed. The MN34 source is earthed, an ENABLE signal being supplied to the gate thereof by way of the inverter 103.

In the driver 124, the MPpower1 is connected in series to the MNR which is connected to the power supply voltage VDD0. A VPP is supplied to the MNR gate. The MPpower1 gate is connected to the MP37 and MP34 drains to which a VDDACTD1 is supplied.

The first step-down voltage circuit 12 configured in this way is obtained by substitution of the first step-down voltage circuit of the embodiment 2 with a general push-pull type circuit. This first step-down voltage circuit 12, similarly to the one of embodiment 2, also comprises an MN33 for inducing offset in the power supply detection circuit as a result of the input of a BANK common overcharge signal to the gate thereof. Here, an MN14 to which the Vcont is input is also provided in this embodiment and, similarly to embodiment 2, the N-channel MOS transistors may be vertically overlapped.

The charge amount supplied to the second step-down voltage circuit can be compensated in this first step-down voltage circuit 12 by activation of the second step-down voltage circuit by a BANK common overcharge signal in conformity with the large current flow produced by overdrive.

Figure 11:
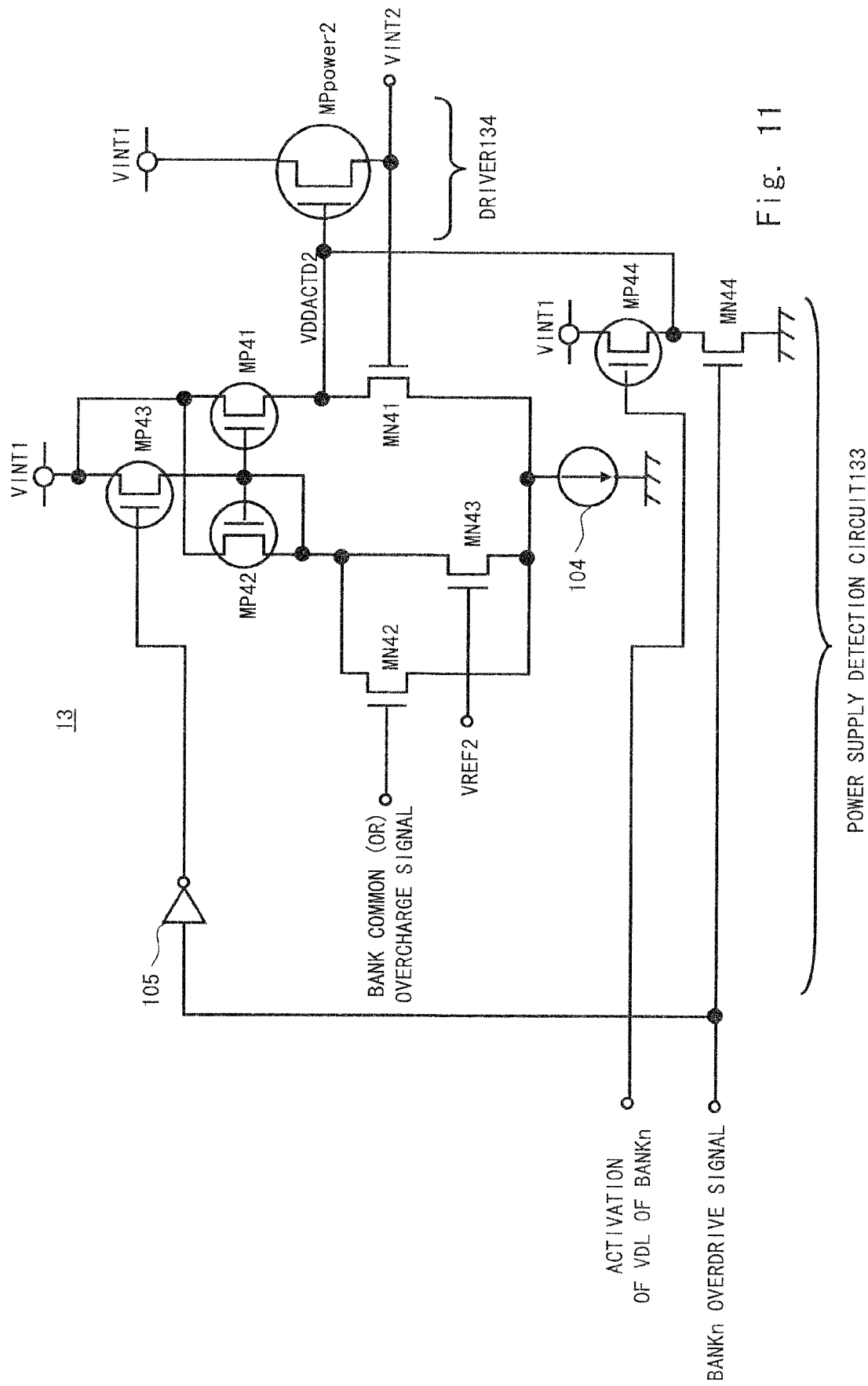
FIG. 11 is a diagram showing a second step-down voltage circuit of third embodiment.

The second step-down voltage circuit 13 of this embodiment will be hereinafter described. FIG. 11 is a diagram showing a second step-down voltage circuit of this embodiment. The second step-down voltage circuit 13 comprises a power supply detection circuit 133 and driver 134.

The power supply detection circuit 133 comprises N-channel MOS transistors MN41 to MN44, P-channel MOS transistors MP41 to 44, a constant current source 104 and an inverter 105. The driver 134 comprises a P-channel MOS transistor MPpower2.

The MP43 source is connected to the VINT1, and a BANKn overdrive signal is supplied by way of the inverter 105 to the gate thereof. The drain thereof has a common connection to the MP42 and MP41 gates. The MP43 functions as a third transistor for turning the amplifiers ON and OFF. The MP43 stops the operation of the amplifiers as a result of being turned ON by the supply of an inverted BANKn overdrive signal. The MP41 and MP42 are configured as a current mirror with the sources thereof connected to the VINT1 and the gates thereof mutually connected. The MP42 gate and drain are short circuited. The MN43 drain is connected to the MP42 drain. The VREF2 is supplied to the MN43 gate. In addition, the MN42, to which a MANK common overcharge signal is supplied to the gate thereof, is connected in parallel with the MN43. The MN43 source is connected to the earth-connected constant current source 104. Furthermore, the MN41 drain is connected to the MP41 drain with its gate connected to the MPpower2 drain. The MN41 drain voltage forms the VDDACTD2 which is supplied to the MPpower2 gate from which the driver 134 is configured. The MPpower2 source is connected to the VINT1 with VITN2 being output from its drain. In addition, the drain of the MP44, of which the source is connected to the VINT1, is connected to the MPpower2 gate. A VDL activation signal is supplied to the MP44 gate. The drain of the MN44, of which the source is earthed, is connected to the MP44 drain. A BANKn overdrive signal is supplied to the MN44 gate.

Figure 12:
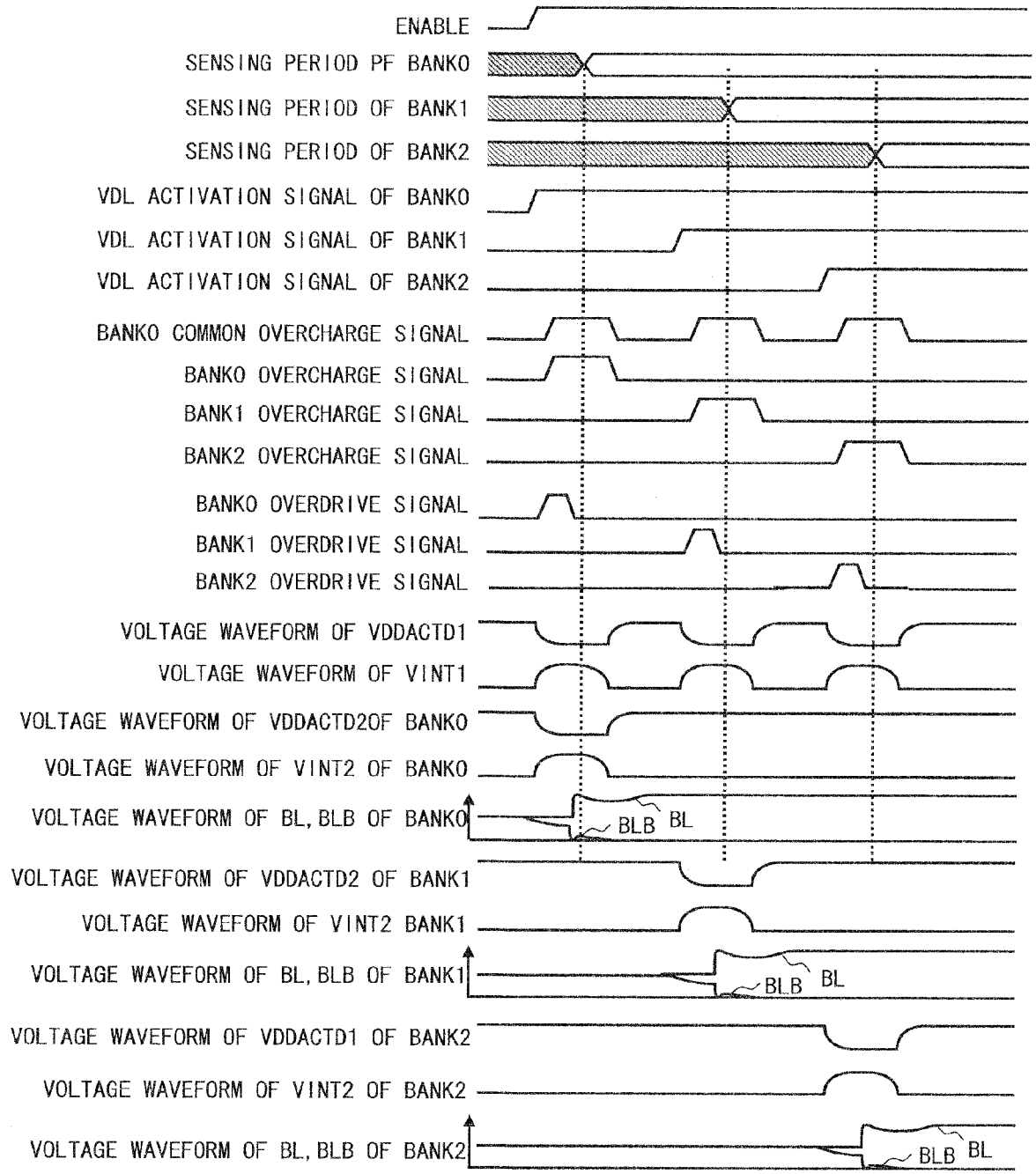
FIG. 12 is a diagram of the signal waveforms of each node.

The operation of the first step-down voltage circuit 12 and second step-down voltage circuit 13 will be hereinafter described. FIG. 12 is a diagram of the signal waveforms of each node. When the ENABLE signal is Low, the MP35, MP36 and NP 37 of FIG. 10 are OFF and, accordingly, the MPpower1 is also OFF.

Next, when the ENABLE signal is High and the BANK common overcharge signal is High, the MP35, MP36 and MP37 of FIG. 10 are OFF and the MN36 is ON. In addition, the MN33 is ON producing a flow of current in parallel to the MN32, MN33. As a result, a pseudo-rise state of the VREF1 is produced. Accordingly, the VINT1 drops, and the current flowing to the MN35 increases. Simultaneously, the flow of current to the MN34 decreases. In response, the VDDACTD1 drops and the VINT1 rises.

Next, when the ENABLE signal is High and the BANK common overcharge signal is Low, the MP35, MP36, MP37 of FIG. 10 are OFF and the MN36 is ON. Because the MN33 is OFF, VREF1=VINT1. Here, when the VINT1 drops, the flow of current to the MN35 increases and the flow of current to the MP34 decreases. In response, an operation is performed so that, as a result of drop in the VDDACTD1 and the rise in the VINT1, VREF1=VINT1.

In addition, in the second step-down voltage circuit 13, the MPpower2 of the driver 134 is turned ON and the VINT2 caused to rise by an overdrive signal and initial-state VDL activation signal of the sensing period. When the overdrive period is long, the VINT2 rises to the VINT1. The overcharge period subsequent to completion of overdrive produces a pseudo-rise state of the VREF2.

When the VDL activation signal is High, the BANK common overcharge signal is High and the BANKn overdrive signal is High, because the MP44 is OFF and the MN44 is ON, the VDDACTD2 is Low and the MNpower2 is ON. As a result, the VINT2 voltage rises. Because the MP43 is OFF, the MP21, MP22 are turned OFF and the operation of the amplifiers stops.

Next, when the VDL activation signal is High, the BANK common overcharge signal is High and the BANKn overdrive signal is Low, the MN44 is OFF. On the other hand, the MP43 is OFF. Accordingly, because the amplifiers are operated and current flows to the MN42, MN43, the VDDACTD2 drops and the VINT2 rises in response thereto.

Furthermore, when the VDL activation signal is High, the BANK common overcharge signal is Low and the BANKn overdrive signal is Low, because the MN42 is OFF, VINT2=VFER2.

In this embodiment, similarly to embodiment 2, the OR of the BANKn overcharge signal input to each BANK is determined and used as a BANK common overcharge signal. In addition, the charge amount supplied to the second step-down voltage circuit 13 is compensated by overdrive of the first step-down voltage circuit performed in conformity with the timing of the overdrive of the second step-down voltage circuit 13. In this way, the responsivity of the first step-down voltage circuit 12 can be improved, the power supply droppage of the first step-down voltage circuit 12 can be suppressed and, in addition, the high-speed operation of the second step-down voltage circuit 13 can be compensated.

Embodiment 4

Figure 13:
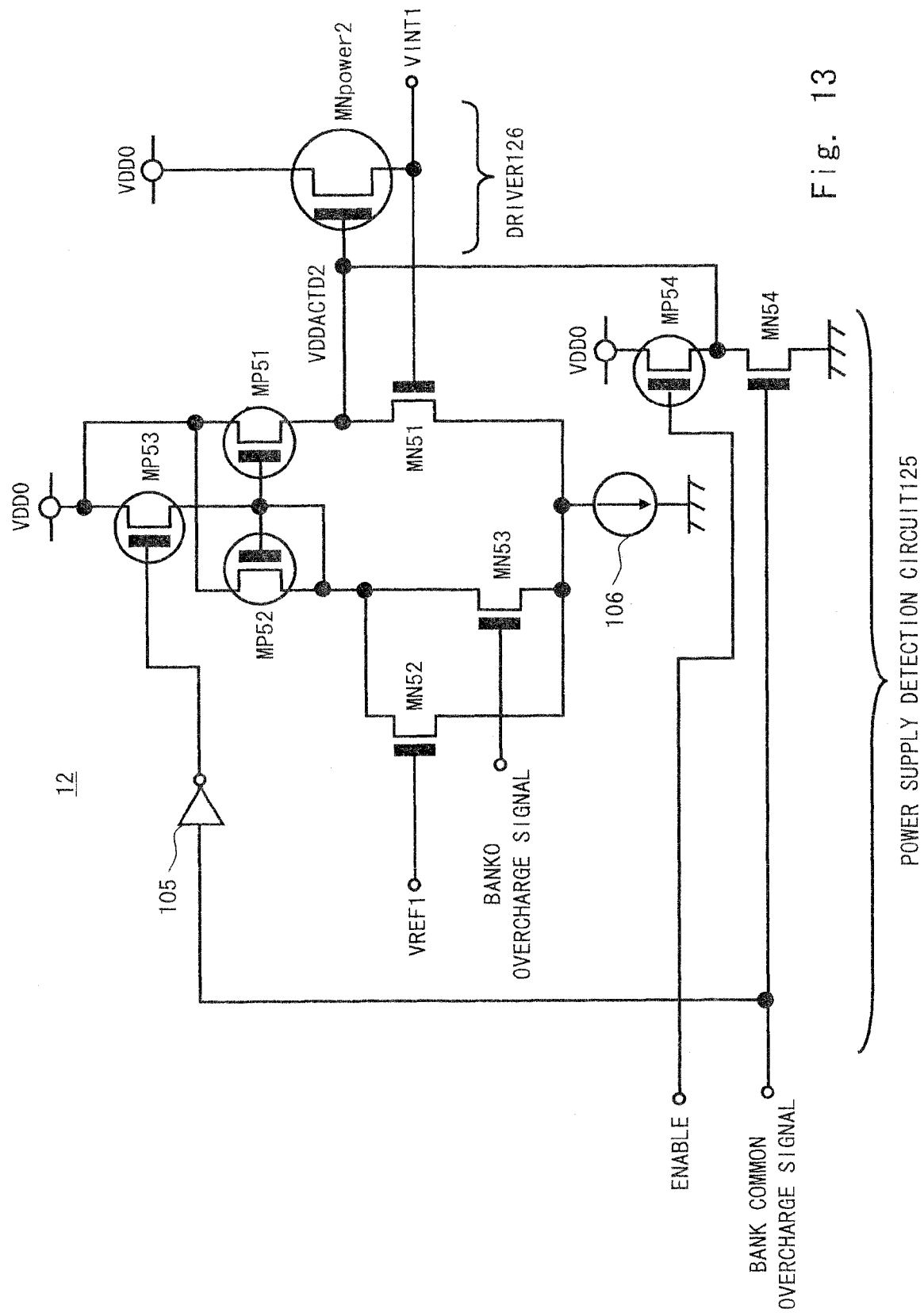
FIG. 13 is a circuit diagram showing a first step-down voltage circuit of fourth embodiment.

Embodiment 4 will be hereinafter described. FIG. 13 is a circuit diagram showing a first step-down voltage circuit of this embodiment. A transistor of the second step-down voltage circuit of embodiment 3 of increased film thickness has application in the first step-down voltage circuit of this embodiment. Because this has application in the first step-down voltage circuit 12, the BANKn overdrive signal input to the N44 of FIG. 11 serves as the BANK common overcharge signal input to the N54. While in this embodiment a BANK common overcharge signal is used, a logically summed signal of the BANKn VDL activation signals may also be input. In addition, instead of the VDL activation signal, an ENABLE signal is used. Furthermore, rather than the first step-down voltage VINT1, the power supply potential VDD0 is supplied. This differs also in the supply of an VREF1 instead of the VREF2 and the supply of a BANKn overcharge signal is supplied instead of the BANK common overcharge signal. In all other respects this embodiment is identical to embodiment 3. The first step-down voltage circuit 12 performs the same operation as performed in embodiment 3 producing the timing chart shown in FIG. 12.

Here, in contrast to embodiment 2 shown in FIG. 3 in which the output driver is an N-channel MOS transistor, in this embodiment it is a P-channel MOS transistor. The common array power supply overdrive-pulling out MOS transistors (MP54, MN54) shown in FIG. 11 are additionally provided in this second step-down voltage circuit 12. These transistors MP54, MN54 function as a forcible-drive circuit that forcibly sets the gate voltage of the driver and, when the ENABLE signal is Low, the NP54 is ON and the driver 126 is OFF.

Figure 14:
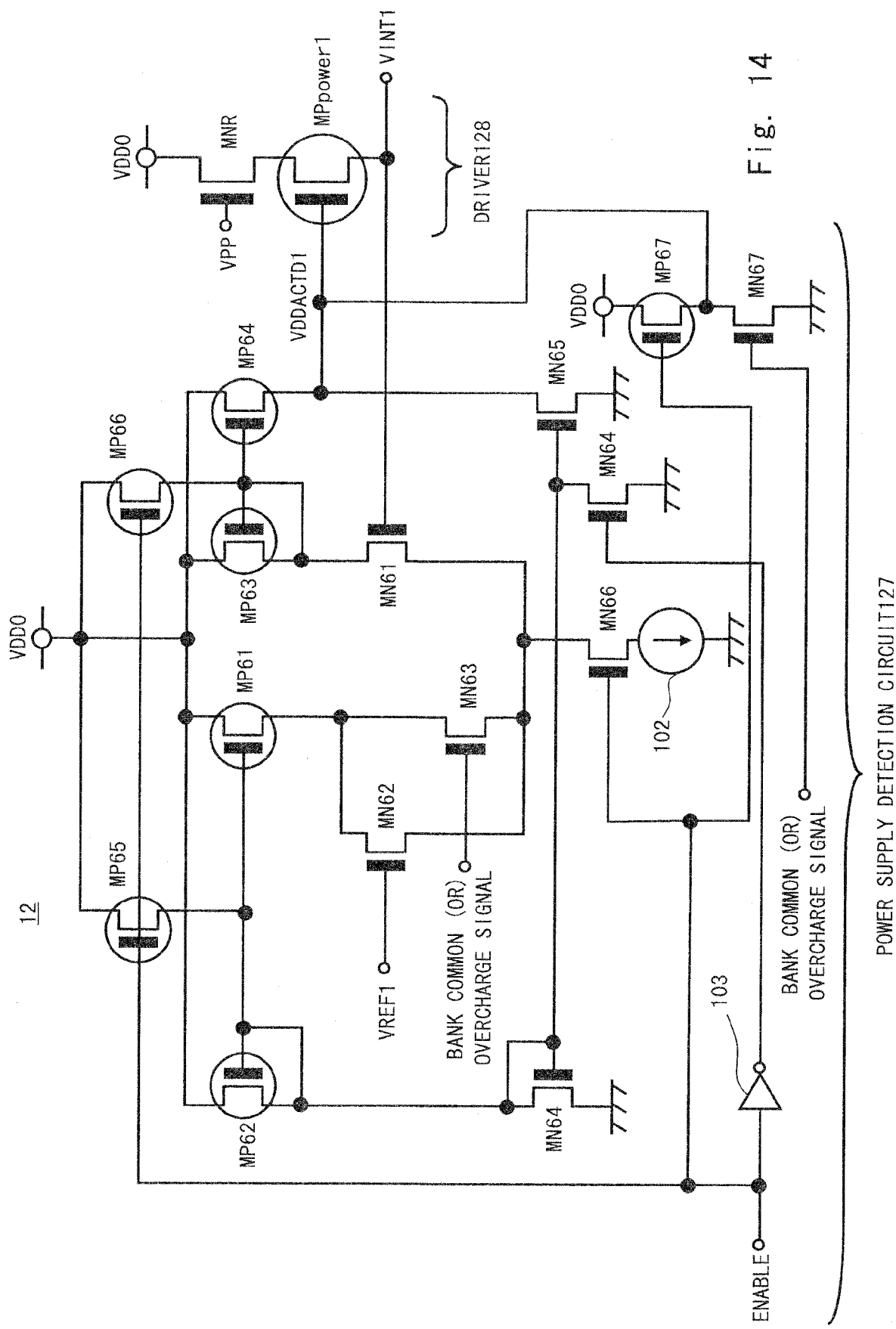
FIG. 14 is a circuit diagram showing a first step-down voltage circuit of a modification of fourth embodiment.

An example of the application of this pulling out MOS transistor in the first step-down voltage circuit shown in FIG. 10 is shown in FIG. 14. FIG. 14 is a circuit diagram showing a first step-down voltage circuit of a modification of this embodiment. As shown in FIG. 14, pulling out transistor MP67, MN67 are additionally provided. That is to say, the transistor MP67 and MN67 are connected in series between earth and the MPpower2 gate. An ENABLE signal is supplied to the MP67 gate. A BANK common overcharge signal is supplied to the MN67 gate. As is described above, the BANK common overcharge signal may be input as a logically summed signal of BANKn BLD activation signals. In this circuit, a timing hart the same as that of FIG. 12 is produced.

Embodiment 5

Figure 15:
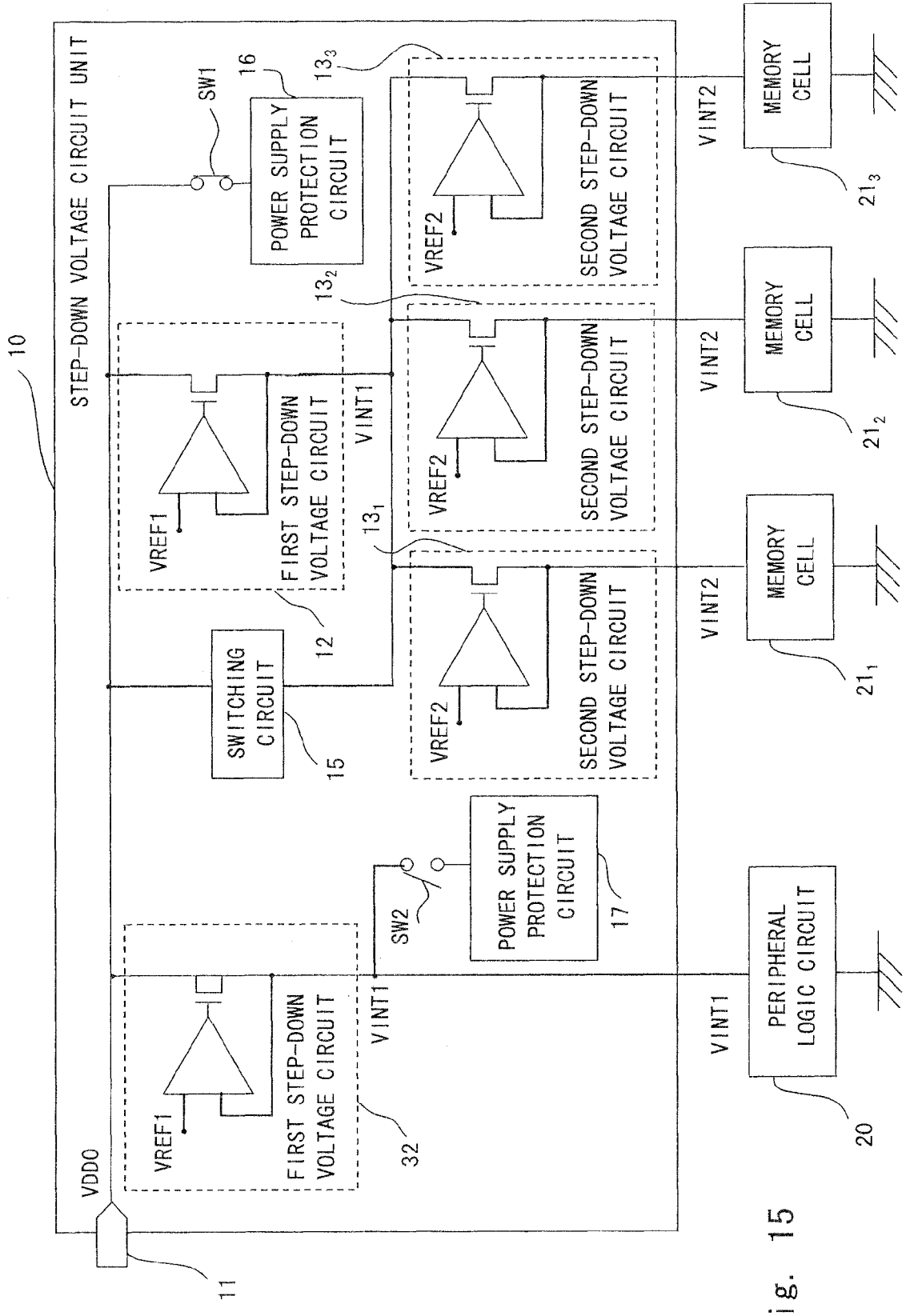
FIG. 15 is a diagram showing a step-down voltage circuit unit of fifth embodiment.

Another example of the step-down voltage circuit unit shown in FIG. 2 described above will be hereinafter described. FIG. 15 is a diagram showing a step-down voltage circuit unit of this embodiment. The step-down voltage circuit unit 10 comprises a first step-down voltage circuit 31 for supplying a first step-down voltage VINT1 to a peripheral logic 20 or the like, and a first step-down voltage circuit 32 for supplying VINT1 to memory cells. By disconnecting the array-operating circuit portion from the peripheral circuit portion, noise interference can be prevented.

Figure 16:
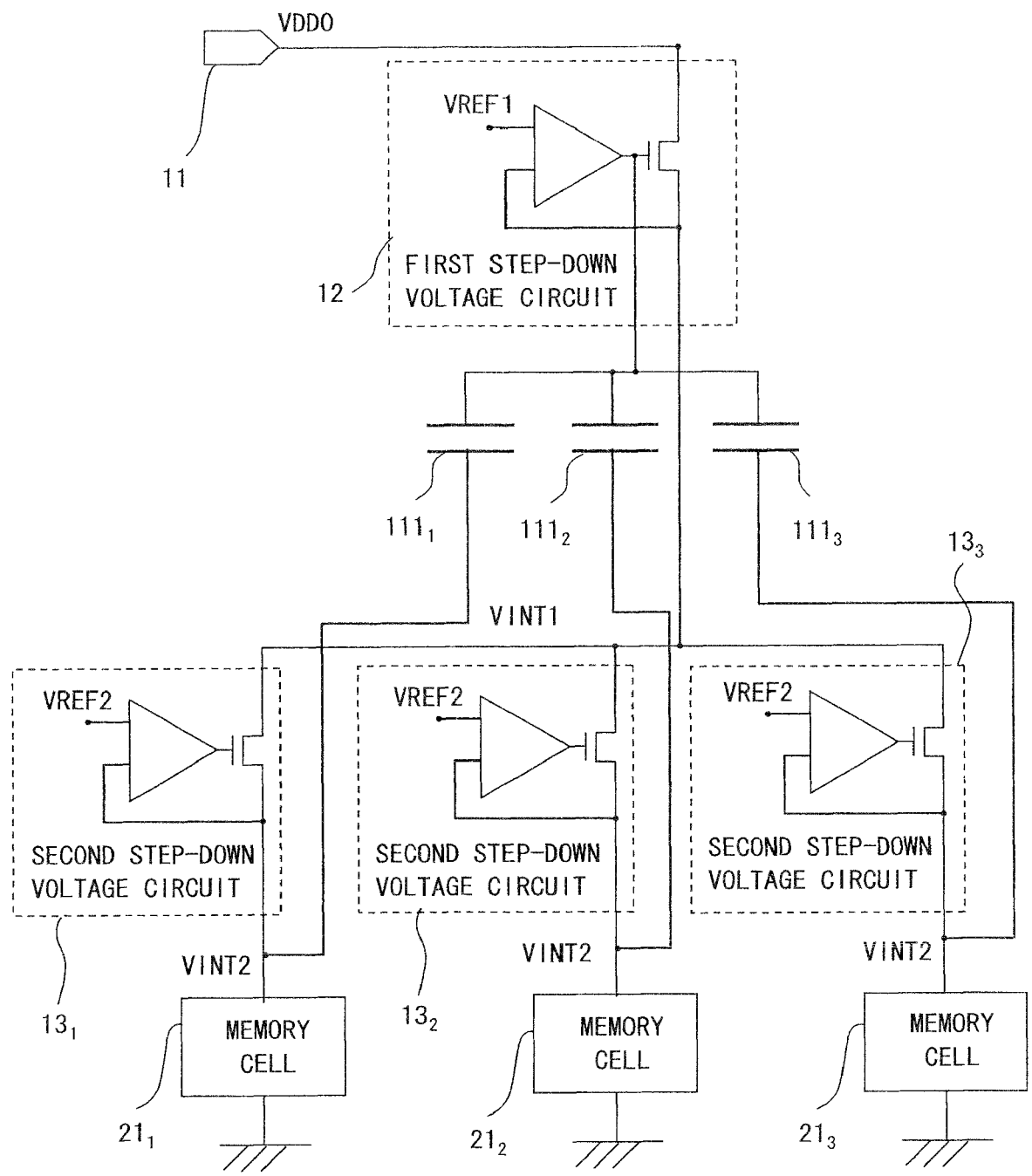
FIG. 16 is a diagram showing another example of a step-down voltage circuit unit of fifth embodiment of the present invention.
Figure 17:
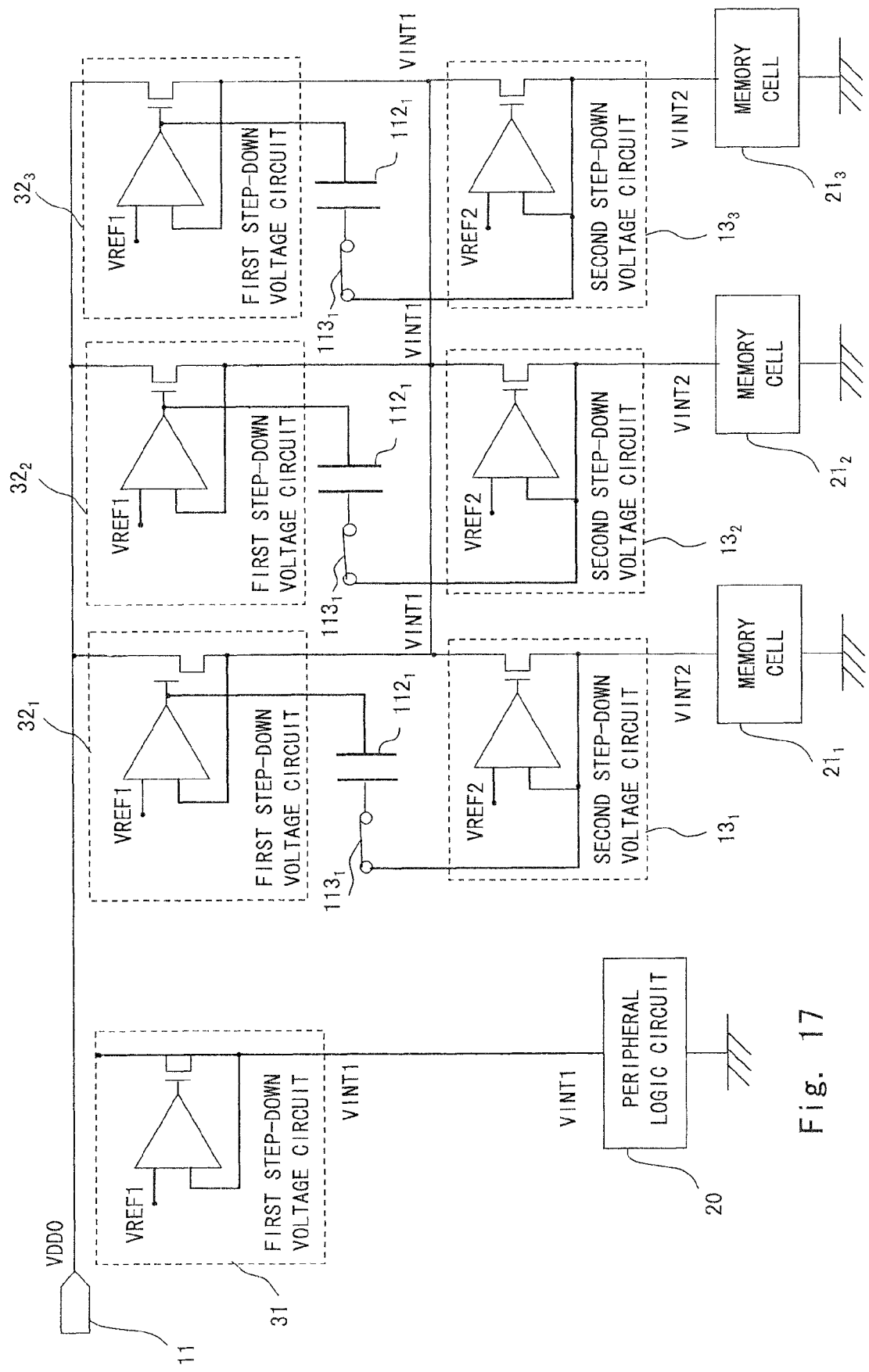
FIG. 17 is a diagram showing a further example of a step-down voltage circuit unit of fifth embodiment of the present invention.
Figure 18:
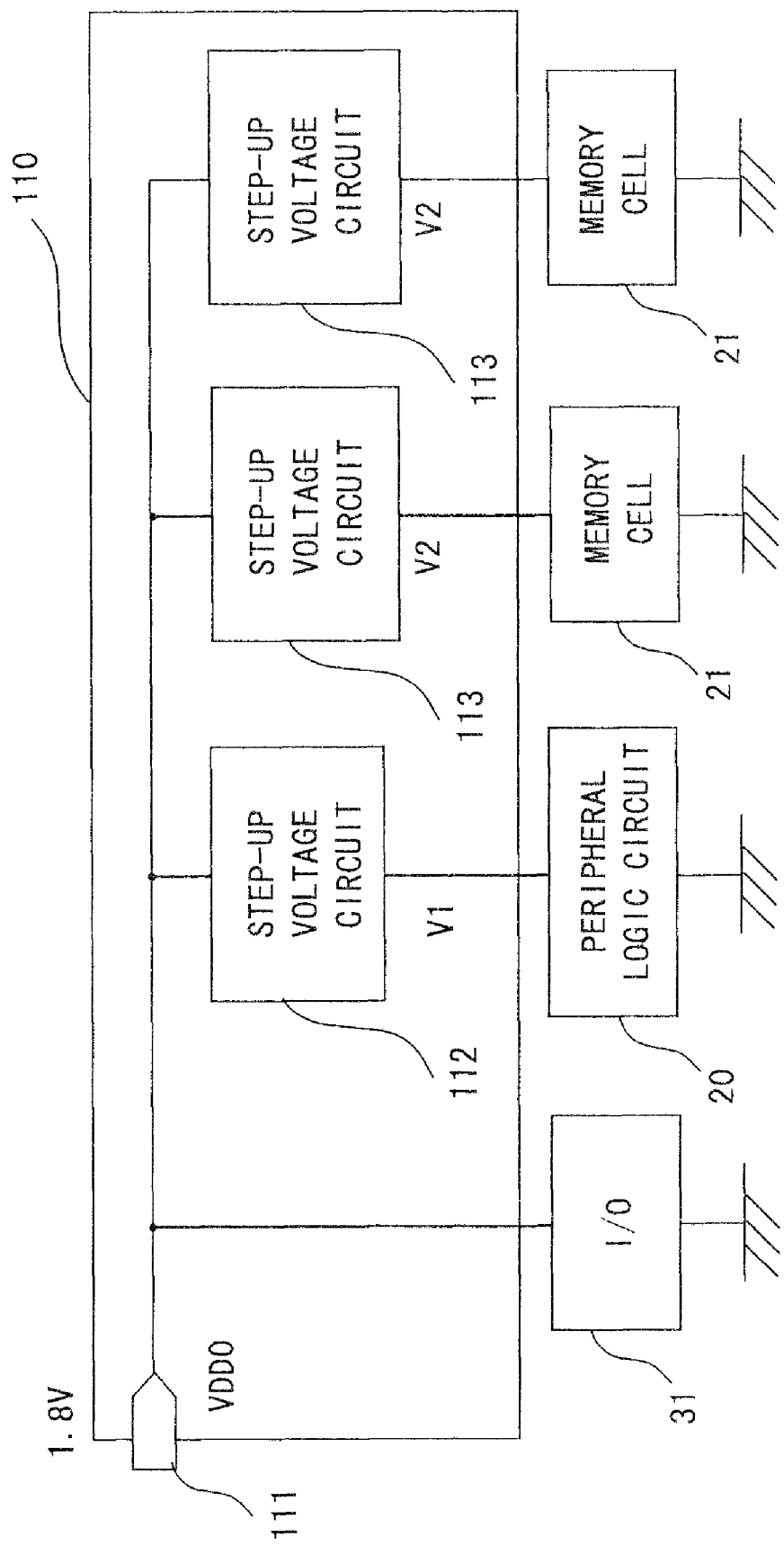
FIG. 18 is a diagram of a memory of related art and a step-down voltage circuit provided in the periphery thereof.
Figure 19:
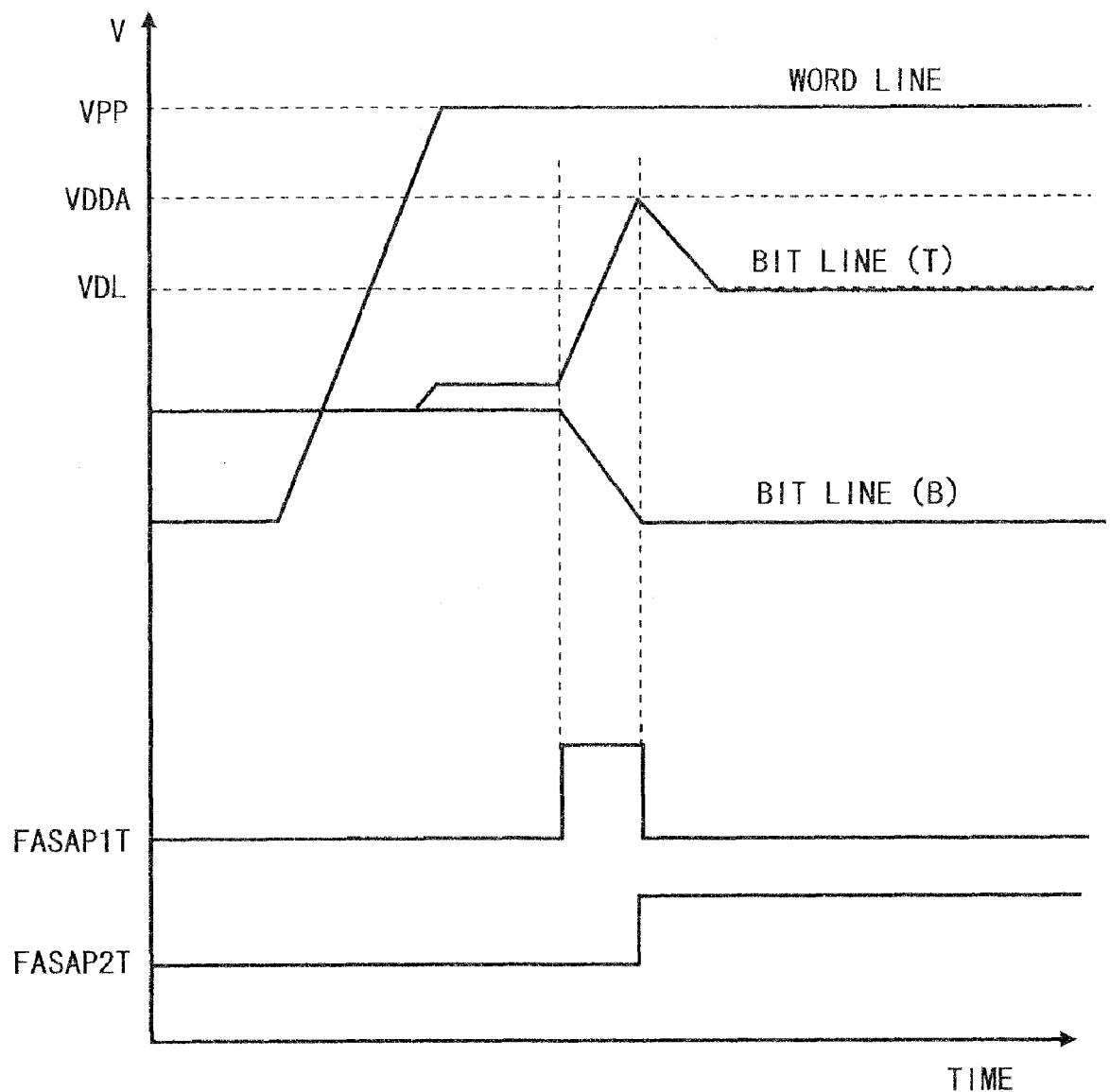
FIG. 19 is a diagram for explaining the overdrive outlined in cited Takemura et al.

FIG. 16 is a diagram showing another example of a step-down voltage circuit unit of embodiment 5 of the present invention, and FIG. 17 is a diagram showing a further example of a step-down voltage circuit unit of embodiment 5 of the present invention. FIGS. 16 and 17 show examples in which the memory cell portion is disconnected from the peripheral circuit portion are separated, and in which compensation capacitances are inserted between a first step-down voltage circuit 32 and second step-down voltage circuits $13_1$ to $13_3$. As shown in FIG. 16, compensation capacitances $111_1$ to $111_3$ are provided between the transistor gate from which the driver of the first step-down voltage circuit 31 is configured and the output of the second step-down voltage circuits $13_1$ to $13_3$. By provision of these compensation capacitances $111_1$ to $111_3$, the first step-down voltage circuit 32 is able to respond to drop in the second step-down voltage circuits $13_1$ to $13_3$. That is to say, the response sensitivity of the first step-down voltage circuit 32 can be raised with respect to sudden power supply drop of each BANK during sensing of the second step-down voltage circuits $13_1$ to $13_3$. Because of the recovery of power supply to each BANK with respect to the drop in power supply is gradual, as is the case in this example, the first step-down voltage circuit 32 may be provided as a multi-BANK common circuit.

In addition, as shown in FIG. 17, first step-down voltage circuits $32_1$ to $32_3$ may be provided for each bank. In this case, compensation capacitances $112_1$ to $112_3$ are connected between the driver gates of the first step-down voltage circuit $32_1$ to $32_3$ and the output of the second step-down voltage circuits $13_1$ to $13_3$. Furthermore, switches $113_1$ to $113_3$ for disconnecting the first step-down voltage circuits $32_1$ to $32_3$ from the second step-down voltage circuits $13_1$ to $13_3$ for a predetermined period may be provided. In this case, when overcharge is sensed, the first step-down voltage circuits $32_1$ to $32_3$ and second step-down voltage circuits $13_1$ to $13_3$ are disconnected by the switches $113_1$ to $113_3$ from during the overcharge period until sensing starts. Here, as a result of a rise of the BANKn VINT2 which constitutes the output voltage of the second step-down voltage circuits $13_1$ to $13_3$ due to overcharge, the gate input of a Pch driver of the first step-down voltage circuit rises in a direction that turns the driver OFF by way of the compensation capacitances $112_1$ to $112_3$. The switches $113_1$ to $113_3$ are provided for the purpose of preventing rise of the gate input of the Pch driver of the first step-down voltage circuit. As a result, the second step-down voltage circuits $13_1$ to $13_3$ can be temporarily disconnected from the first step-down voltage circuits $32_1$ to $32_3$, and connected at the start of sensing by the sensing operation that the VINT2 has dropped.

In this configuration as well, the responsivity of the first step-down voltage circuit to the sudden power supply drop of each BANK during sensing of the second step-down voltage circuits $13_1$ to $13_3$ is improved. In addition, as is the case in this example, by provision of first step-down voltage circuits $32_1$ to $32_3$ and second step-down voltage circuits $13_1$ to $13_3$ for each BANK, further responsivity improvement in the first step-down voltage circuits $32_1$ to $32_3$ can be achieved.

It is apparent that the present invention is not limited to the above embodiment, but may be modified and changed without departing from the scope and spirit of the invention.

What is claimed is:

1. A semiconductor device, comprising:
 a first step-down voltage circuit that generates a first step-down voltage and provides the first step-down voltage to a first power supply line, the first step-down voltage being lower than a power supply voltage;
 a plurality of second step-down voltage circuits connected to the first power supply line, each of said second step-down voltage circuits generating a second step-down voltage lower than the first step-down voltage; and
 a switching circuit to select and supply one of either the power supply voltage or the first step-down voltage to the second step-down voltage circuits,
 wherein the first step-down voltage circuit has a withstand voltage equal to or higher than the power supply voltage,
 wherein the second step-down voltage circuit has a withstand voltage equal to or higher than the first step-down voltage,
 wherein the first step-down voltage circuit comprises a transistor having an oxide film with a first thickness, and
 wherein each of the second step-down voltage circuits comprises a transistor having an oxide film thinner than the first thickness.

2. The semiconductor device according to claim 1, wherein the first step-down voltage circuit supplies voltage to a peripheral logic.

3. The semiconductor device according to claim 1, wherein the second step-down voltage circuit supplies voltage to a memory cell.

4. The semiconductor device according to claim 1, further comprising:
 a first power supply protection circuit connected to a power supply voltage line and a second power supply protection circuit connected to a first step-down voltage line,
 the first power supply protection circuit being turned ON when the power supply voltage is supplied to the first step-down voltage circuit, and the second power supply protection circuit being turned ON when the power supply voltage is supplied to the second protection circuit.

5. The semiconductor device according to claim 1,
 wherein the first step-down voltage circuit comprises a driver and a power supply detection circuit to drive the driver,
 the power supply detection circuit comprising an amplifier comprising a first transistor to the gate of which a reference voltage is input and a second transistor that configures a differential pair therewith, and a voltage adjustment transistor which is connected in parallel with the first transistor and which adjusts the first step-down voltage.

6. The semiconductor device according to claim 5, wherein a logically summed signal of overcharge signals corresponding to a plurality of memory banks is input to the voltage adjustment transistor.

7. The semiconductor device according to claim 5, further comprising:
 a current adjustment transistor to adjust current flowing to the voltage adjustment transistor.

8. The semiconductor device according to claim 5, comprising:
 a third transistor to control ON/OFF of the amplifier.

9. The semiconductor device according to claim 5,
 wherein the driver is configured from a P-channel MOS transistor,
 the semiconductor device further comprising a forcible-drive circuit for forcibly setting a gate voltage of the P-channel MOS transistor.

10. The semiconductor device according to claim 5, further comprising:
 an (N−1) number of transistors connected in parallel with the voltage adjustment transistor, overcharge signals corresponding to an N number of memory banks being input to the voltage adjustment transistor and (N−1) number of transistors, respectively.

11. The semiconductor device according to claim 1,
wherein the second step-down voltage circuit comprises a driver and a power supply detection circuit for driving the driver, the power supply detection circuit comprising an amplifier comprising a first transistor to the gate of which a reference voltage is input and a second transistor that configures a differential pair therewith, and a voltage adjustment transistor which is connected in parallel with the first transistor and which adjusts the second step-down voltage.

12. The semiconductor device according to claim 1,
wherein the first step-down voltage circuit comprises a driver and a power supply detection circuit for driving the driver, the power supply detection circuit comprising:

a first transistor to the gate of which a reference voltage is input and a second transistor that configures a differential pair therewith;

an earth-connected first current source;

a second current source transistor connected between the first current supply source and the differential pair; and a switching transistor which is connected in parallel with the second current source transistor and which switches between validation and invalidation of the second current source transistor.

13. A memory, comprising:

a first step-down voltage circuit which is commonly provided for a plurality of banks and which generates, from a power supply voltage, a first step-down voltage lower than the power supply voltage, the first step-down voltage being provided to a first power supply line;

plural second step-down voltage circuits which are individually provided for each bank and which generate, from the first step-down voltage, a second step-down voltage lower than the first step-down voltage, the second step-down voltage circuit being connected to the first power supply line;

a plurality of memory banks driven by the second step-down voltage; and a switching circuit to select and supply one of either the power supply voltage or the first step-down voltage to the second step-down voltage circuits, wherein the first step-down voltage circuit has a withstand voltage no lower than the power supply voltage, and the second step-down voltage has a withstand voltage no lower than the first step-down voltage, and wherein the first step-down voltage circuit comprises a transistor having an oxide film with a first thickness and the second step-down voltage circuits each comprises a transistor having an oxide film thinner than the first thickness.

14. The memory according to claim 13,
wherein the first step-down voltage circuit and the second step-down voltage circuit are provided for each of the memory banks.

15. The memory according to claim 13, further comprising:

a compensation capacitance connected between the first step-down voltage circuit and the second step-down voltage circuit.

16. The memory according to claim 15, further comprising:

a switch for disconnecting the first step-down voltage circuit from the second step-down voltage circuit for a predetermined period.

* * * * *